(12) United States Patent
Yamaguchi et al.

(10) Patent No.: US 7,957,945 B2
(45) Date of Patent: Jun. 7, 2011

(54) INUNDATION SIMULATOR AND PROGRAM

(75) Inventors: Satoshi Yamaguchi, Kokubunji (JP);
Kazuaki Iwamura, Nishitokyo (JP);
Tsutomu Ikeda, Abiko (JP)

(73) Assignee: Hitachi Engineering & Services Co., Ltd., Ibaraki (JP)

( * ) Notice: Subject to any disclaimer, the term of this patent is extended or adjusted under 35 U.S.C. 154(b) by 948 days.

(21) Appl. No.: 11/689,637

(22) Filed: Mar. 22, 2007

(65) Prior Publication Data
US 2007/0225955 A1    Sep. 27, 2007

(30) Foreign Application Priority Data

Mar. 24, 2006    (JP) ................. 2006-081881

(51) Int. Cl.
*G06G 7/50*    (2006.01)
*G06G 7/48*    (2006.01)
(52) U.S. Cl. ............................................. 703/9; 703/6
(58) Field of Classification Search .............. 703/9, 6
See application file for complete search history.

(56) References Cited

FOREIGN PATENT DOCUMENTS
JP    2004-197554    7/2004

OTHER PUBLICATIONS

Haile et al., Effects of LiDAR DEM. Resolution in Flood Modelling : A Model Sensitivity Study for the City of Tegucigalpa, Honduras, Sep. 12-14, 2005, ISPRS WG III/3, III/4, V/3 Workshop "Laser scanning 2005", Enschede, the Netherlands pp. 168-173.*
Haile, Integrating Hydrodynamic Models and High Resolution DEM (LIDAR) For Flood Modelling, Mar. 2005, International Institute for Geo-Information Science and Earth Observation Enschede, The Netherlands.*

* cited by examiner

*Primary Examiner* — Jason Proctor
*Assistant Examiner* — Aniss Chad
(74) *Attorney, Agent, or Firm* — Mattingly & Malur, PC

(57) ABSTRACT

An inundation simulation program and device using the same for displaying a map, receiving input from a user indicating a starting point and an ending point in a bank breakage section on the map, and displaying on the map a line connecting the starting point and the ending point. Further, the computer program and device calculates a direction of a flow quantity in the bank breakage section by calculating a normal line to the side of the inside area of the bank at the input band breakage section and making the bank breakage section discrete in the calculation grids of the inundation simulation.

12 Claims, 18 Drawing Sheets

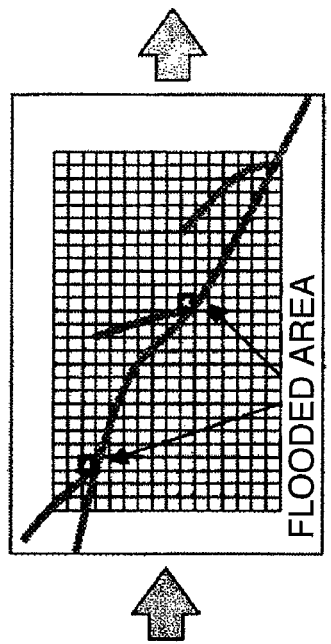
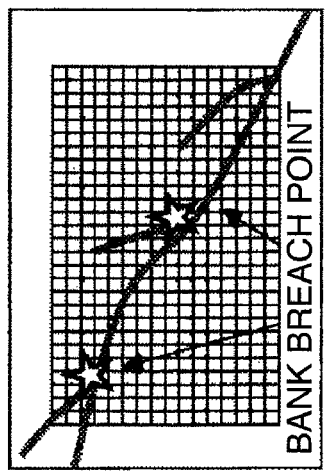
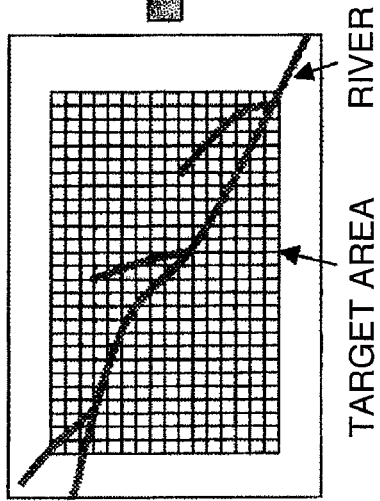
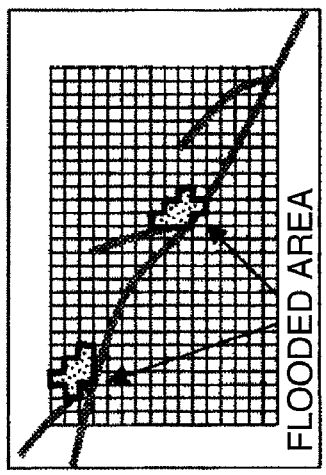
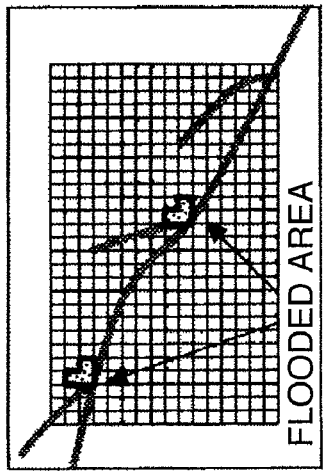

t = 0 t = Δt t = 2Δt t = 3Δt

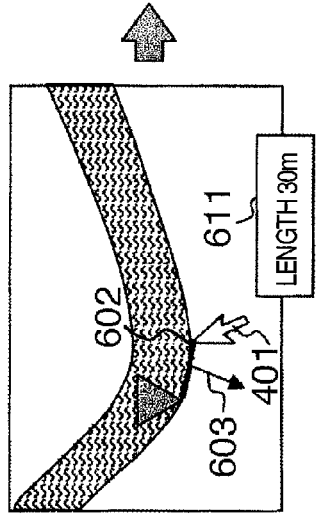
FIG. 6A
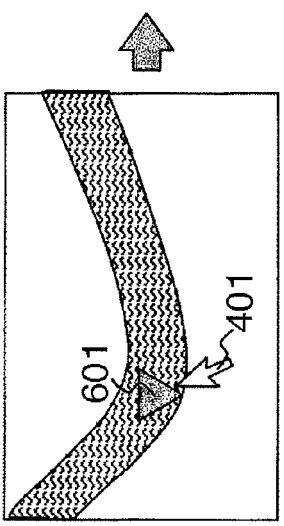
FIG. 6B
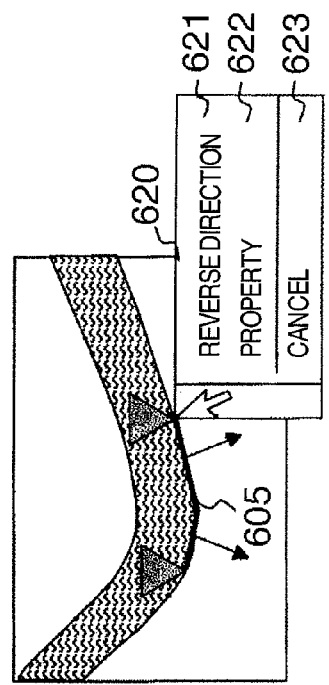
FIG. 6C
FIG. 6D
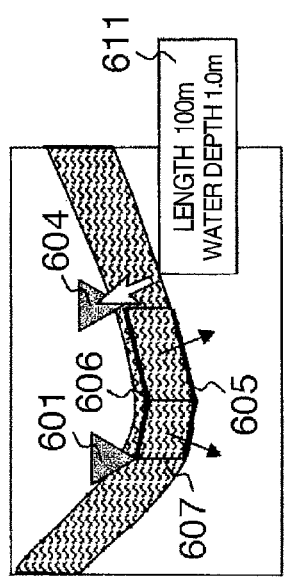
FIG. 6E

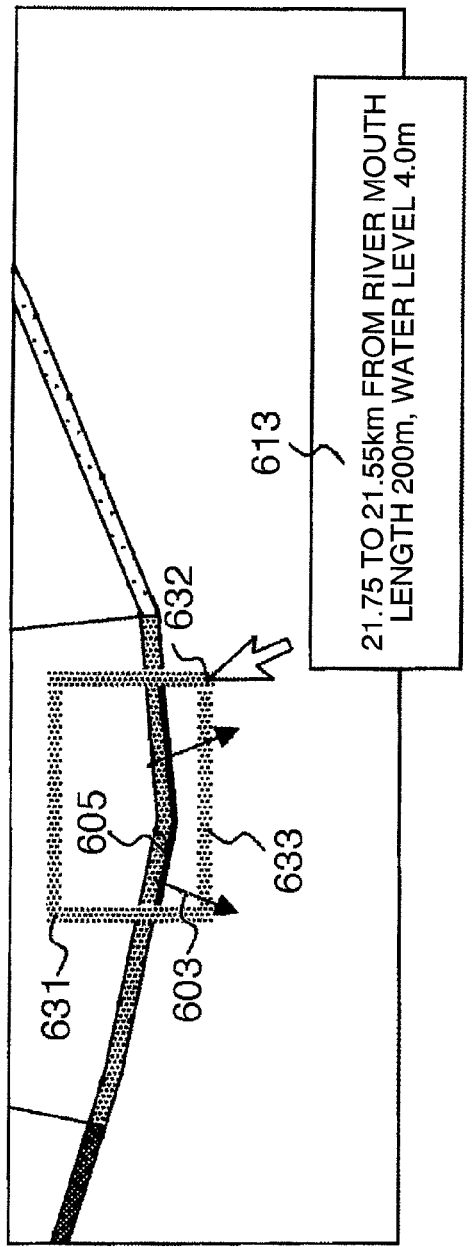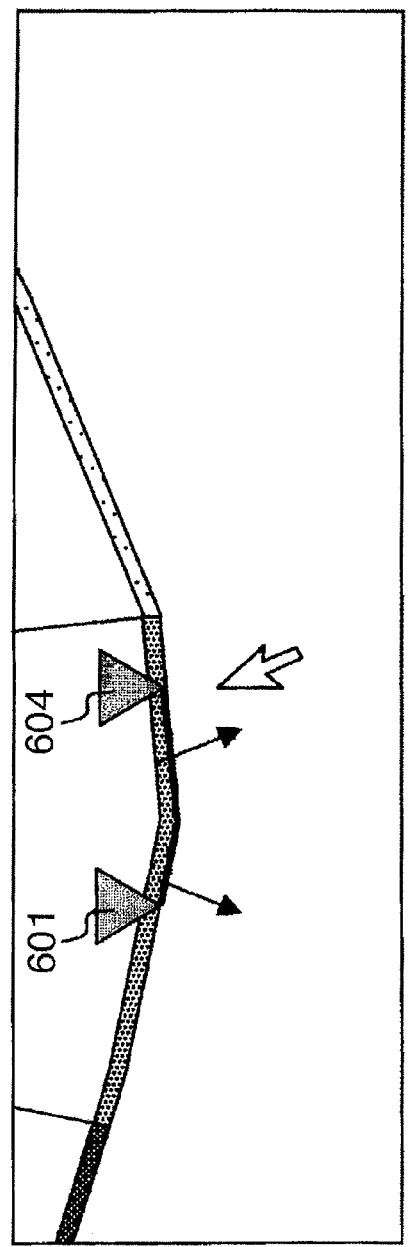

FIG. 17

| BANK BREACH SECTION AREA | |
|---|---|
| TIME | $t_0$ |
| STARTING POINT | $r_0(t_0)$ |
| ENDING POINT | $r_1(t_0)$ |
| HEIGHT OF CEILING | $Z_{rep}(t_0)$ |
| TIME | $t_0$ |
| STARTING POINT | $r_0(t_0)$ |
| ENDING POINT | $r_1(t_0)$ |
| HEIGHT OF CEILING | $Z_{rep}(t_0)$ |
| ------ | |

~ 1710

INUNDATION SIMULATOR AND PROGRAM

CLAIM OF PRIORITY

The present application claims priority from Japanese application JP 2006-081881 filed on Mar. 24, 2006, the content of which is hereby incorporated by reference into this application.

BACKGROUND OF THE INVENTION (1) Field of the Invention

The present invention relates to a device for predicting and analyzing an inundation phenomenon that causes flood disaster. More specifically, the present invention relates to an inundation simulating system that simulates a process of water flowing from a river into an urban area using a computer and displays spatial information obtained from the simulation on a computer display.

(2) Description of the Related Art

Recently, in order to mitigate natural disasters, an attempt to predict such disasters has been drawing attention. To predict natural disasters, a simulation with a computer has proven effective. In the simulation, the prediction variables in the calculation grid/grids represent the disaster state, and changing of the prediction variables by time based on the physical rule represents the disasters changed in time. As an example of the simulation, an inundation simulation in which water overflowing from the river and flooding the city is known. In the inundation simulation, the calculation grids are arranged in the city. The variables representing the flood velocity and the water depth placed on the calculation grids are changed based on the physical rule called "shallow water equations". In the inundation simulation, boundary conditions must be set. The boundary conditions are a bank breach section or inflow sections, or an overflowing section. Hereinafter, the conditions about the inflow sections are called "bank breach conditions", assuming the bank breach is a typical cause of overflow from the river.

For example, a "real time dynamic inundation simulation system" described in Patent Document 1, JP-A-2004-197554, discloses the invention relating to a system for realizing the inundation simulation. That enables a user to specify one point on a map displayed on the display of the system as a bank breach point and set the bank breach conditions on the calculation grids arranged over the point. The bank breach conditions of the system include a length of the bank breach along the river bank, a water level at the bank breach and a height of the bank breach. The bank breach point is the representative point of the bank beach, the length of the bank breach is the length of the bank breach along the river, the water level of the bank breach is the water level at the bank breach point and the height above sea level of the bank breach is the height above sea level at the bank breach point.

In the conventional simulation system, the bank breach conditions are given to one point on a map as shown in the Patent Document 1.

In the conventional simulation system, however, problems described below occur.

1. The bank breach length, which is one of the bank breach conditions, is only represented by a numeral value, and a user cannot visually recognize the length of the bank breach. Thus, the user may set an unrealistic value for the bank breach length.
2. The direction of the flow quantity at the bank breach flow (the flow quantity that passes the inflow section), which is one of the bank breach conditions, is not decided automatically.
3. The bank breach length must be shorter than the calculation grid intervals. In other words, the bank breach conditions in which the bank breach covers over a plurality of calculation grid/grids cannot be input.

The problems are caused by the bank breach being approximated with a representative point and a length. If the length of the bank breach is short enough relative to the size of the calculation grid/grids, then the approximation does not cause a significant error. Generally, it is known that the length of the bank breach at a middle size river in Japan is about 50 to 200 m. In the conventional inundation simulation, the size of the calculation grid/grids is set at about 250 m because if the size of the calculation grid/grids is too short, the calculation does not complete in a practical time period.

In order to perform highly accurate simulation, the calculation grid/grids need to be short. If the length of the bank breach is equal to or longer than the size of the calculation grid/grids, an error due to approximation cannot be ignored.

BRIEF SUMMARY OF THE INVENTION

The present invention is adapted in view of the foregoing problems and intends to provide a simulation device that visually presents a length of bank breakage to a user, decides the direction of the river water overflowing from the bank breach place, and be able to perform simulation whether the bank breach is on a calculation grid/grids or covers over a plurality of calculation grids.

The typical summary of the present invention will be discussed below.

An inundation simulation program and the device using the same for performing an inundation simulation with a flow quantity vector by displaying a map, deciding a line indicating an inflow section from the input specification in response to the specification of the inflow section from a user on the map, calculating the direction of the flow quantity vector from the direction of the line and displaying the direction on the map.

According to the present invention, the effects below are available.
1. The inflow section is approximated with a shape on a map.
2. By using the shape of the inflow section, the direction of the amount of bank breach flow can be estimated.
3. By using the shape of the inflow section, the direction of the flow and the geographic arrangement of the calculation grid/grids, conditions of the inflow section can be set whether or not the bank breach length is longer than the grid size.

Other objects, features and advantages of the invention will become apparent from the following description of the embodiments of the invention taken in conjunction with the accompanying drawings.

BRIEF DESCRIPTION OF THE DRAWINGS

FIGS. 1A to 1E are general views showing examples of a calculating process of the inundation simulation;

FIGS. 6A to 6E are diagrams showing examples of the GUI with which a user performs a bank breakage section creating operation;

FIGS. 16A to 16B are diagrams showing an example of the GUI where a user performs a bank breakage section creating operation;

FIG. 17 is a diagram showing an example of a structure on the memory of the bank breakage conditions data 333 according to the second embodiment.

DETAILED DESCRIPTION OF THE INVENTION

Figure 2A:
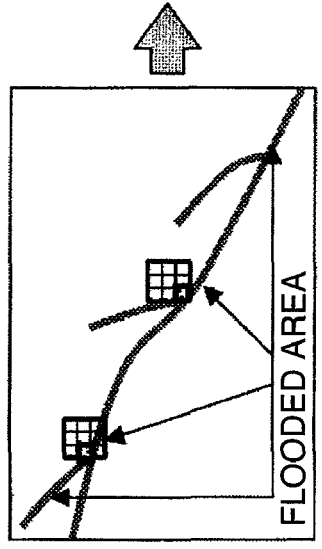
FIGS. 2A to 2E are general views showing examples of a calculating process of an inundation simulation applied with the Dynamic DDM.
Figure 2B:
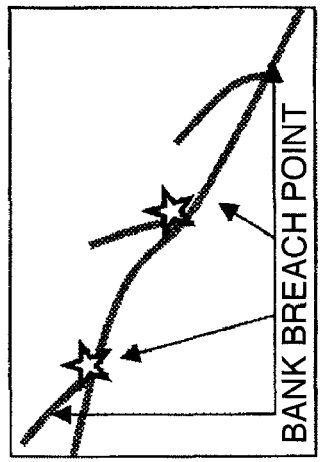
Figure 2C:
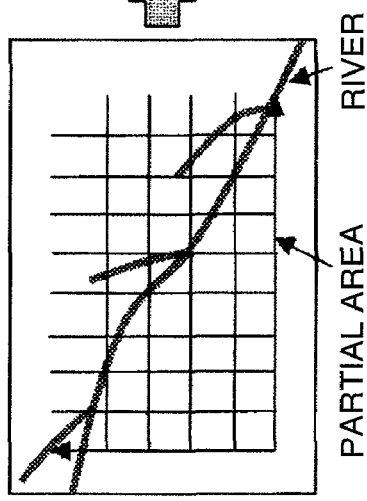
Figure 2D:
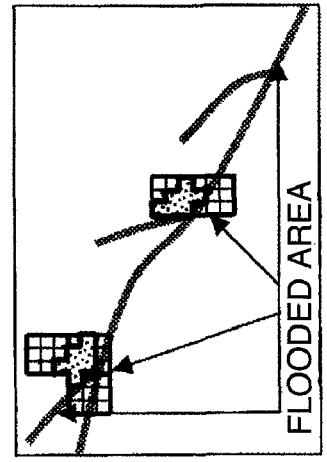
Figure 2E:
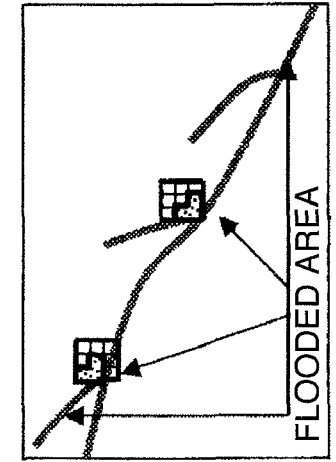

First, an approach for completing a calculation within a practical time period while decreasing a calculation grid/grids size in order to increase accuracy of the simulation is disclosed. Hereinafter, the calculation method is called Dynamic DDM (Domain Decomposition Method). By applying the Dynamic DDM, the calculation grid/grids size can be set from about 10 to 50 m.

First, calculation processes of an inundation simulation will be described. FIG. 1 is a general view showing a calculation process of the inundation simulation. Before starting the simulation, the target area is set and calculation grids are arranged in the target area (FIG. 1A). When a user inputs a bank breakage place, the inundation simulation starts (FIG. 1B). After starting, shallow water equations are solved and prediction values in all the calculation grids in the target area are updated after the time $\Delta t$. One time interval of updating processing is called a time step. A state where the time step is repeated once after the simulation has started, i.e., the state where time $t=\Delta t$ passed after the simulation has started is shown in FIG. 1C. Similarly, the state where the time step is repeated twice after the simulation has started ($t=2\Delta t$) is shown in FIG. 1D, and the state where it is repeated for a third time ($t=3\Delta t$) is shown in FIG. 1E. As such, by repeating the time step, a state of the inundation at a certain time is calculated.

The flooded area in the inundation simulation is smaller than an area to be simulated (i.e. a target area). As for the target area, all the river basin (about 500 km$^2$) can be considered. A flooded area in Japan is mostly about 5 km$^2$. In such a case, about 1/100 of the target area is the area to be flooded. The remaining area that is not flooded has a water depth, h=0 m, the current speed (u, v)=(0, 0) m/s, so that the shallow water equations need not be solved in this area. The conventional approach for solving the shallow water equations in both the flooded area and the area not flooded leads to unneeded calculations.

Next, the flow of the Dynamic DDM process is shown in FIG. 2. FIG. 2 is a general view showing a calculating process of an inundation simulation applied with the Dynamic DDM. In the Dynamic DDM, first, the target area is divided into partial areas (FIG. 2A). In each partial area, calculation grids are arranged. When a user inputs the bank breakage place, the inundation simulation starts (FIG. 2B). First, a partial area which may be flooded in the next time step is determined. Next, the shallow water equations are solved for only the partial area that may be flooded and the predicted values are updated (FIG. 2C, FIG. 2D, FIG. 2E).

The Dynamic DDM solves the shallow water equations for only the partial area that may be flooded in the next time step. Assuming the flooded area is about 5 km$^2$, the target area is about 500 km$^2$, the number of calculation grids for solving the shallow flooding calculation with Dynamic DDM is about 1/100 the conventional approach. Thus, the Dynamic DDM can significantly reduce the calculation time.

In the present application, the above-mentioned problem, i.e., the problem involved in approximating the inflow section by a representative point and a length, becomes remarkable when short calculation grids are used. For that purpose, a device for simulating the inundation phenomenon with the means below should be prepared.

First, processing for approximating the inflow section as a line shape such as a line graph and a curve graph is performed. In the conventional method for approximating the inflow section by a representative point and a length, the inflow section cannot be expressed as a shape. In the configuration of the present application, the inflow section can be expressed as a shape so that the inflow section can be expressed on a map.

Conditions in the inflow section cannot be used in the inundation simulation only by expressing the inflow section by a shape. In order to do that, a shape, an inflow section and the inundation simulation need to be associated with one another. In the application, a direction of the velocity of flow at the inflow section is calculated from a line graph and processing for outputting conditions of the inflow section into variables used in the simulation is performed. In the processing for calculating a direction of flow at the inflow section from the line graph, characteristics of the fluid about the shape and the direction of the flow at the inflow section is used. It is known that a component of the direction that is orthogonal to a line structure such as a bank predominates in the flow that is over the line structure. For example, in the flow from the inflow section, a component that is orthogonal to the flow of the river predominates. By using these characteristics, water inundations from the river ("outside" area of the bank) can be estimated to flow in the direction of the normal line at the city side ("inside" area of the bank) of the line shape that is approximated at the broken place of the bank.

In the processing for outputting the conditions at the inflow section into variables used in the simulation, the geometric arrangement of the line shape, a direction of the flow, and a calculation grid/grids are used. First, calculation grids including the line shape are detected and the length of the line included in the grid/grids is calculated. According to the length, a scalar value can be allocated to the calculation grids.

The direction of the flow and the relative angle of the calculation grid/grids are calculated. According to the relative angle, a vector value can be allocated to the calculation grids.

As such, the above-mentioned problem in the inundation simulation can be solved by performing three processes.

An embodiment of the inundation simulation device with an interface for inputting conditions of the inflow section of the present invention will be described with reference to the attached drawings.

[Embodiment 1]

Figure 3:
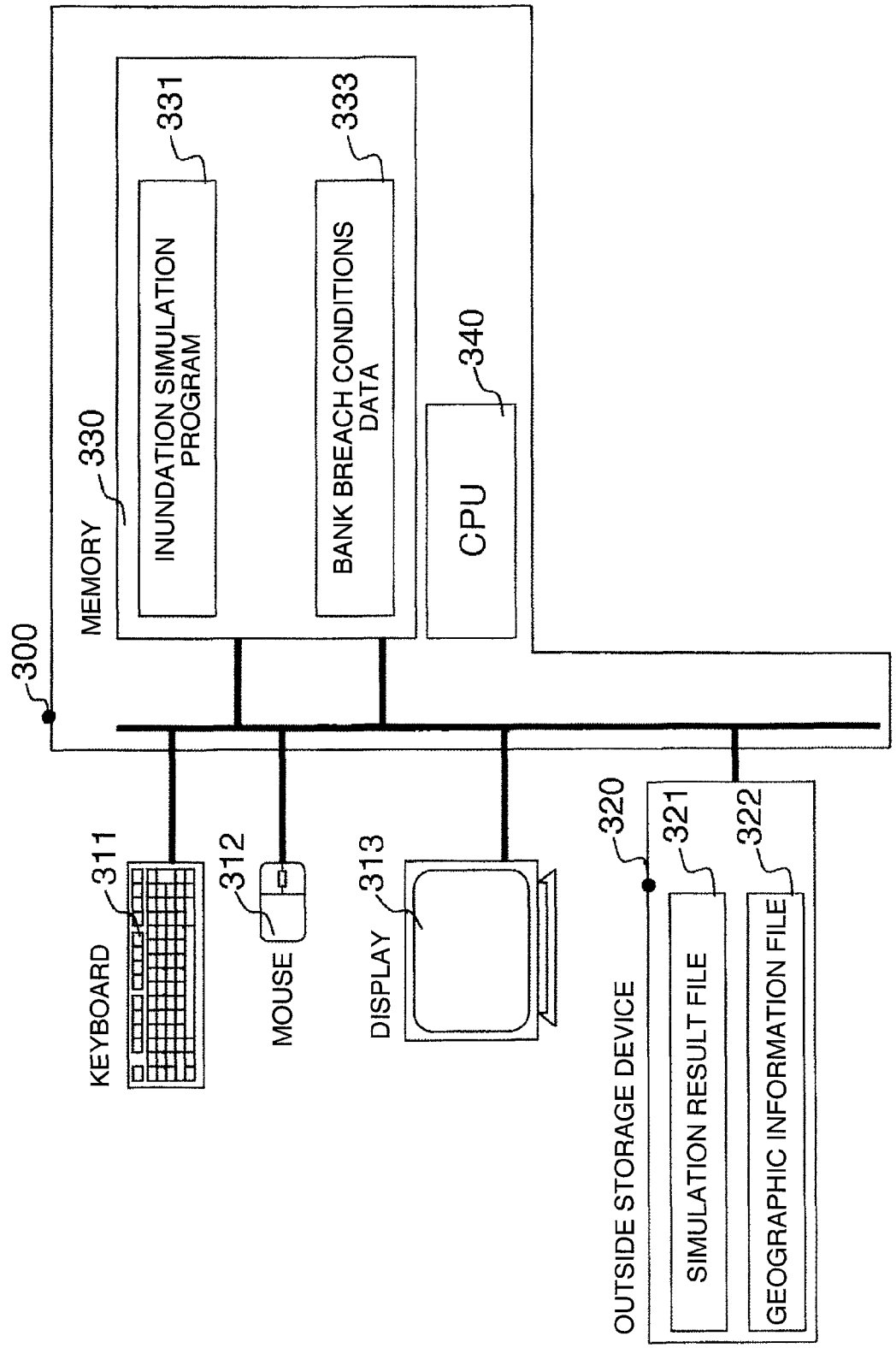
FIG. 3 is an outlined block diagram showing an example of a configuration of a computer system for implementing the present invention in a first embodiment.

FIG. 3 is an outlined block diagram showing a configuration of a computer system for implementing the present invention in the embodiment 1. A user of the inundation simulation device inputs an instruction from an input part such as a keyboard 311 or a mouse 312 connected to a PC (Personal Computer) 300 and checks the result of the simulation at the output part such as a display 313 or the like. Inside the PC 300, CPU (Central Processing Unit) 340 performs the order based on the inundation simulation program 331 that extracted in a memory 330. The CPU 340 reads out a geographic information file 322 stored in the outside storage device 320 such as a hard disk as required, while the inundation simulation program 331 is performed. The inputted breakage conditions are extracted in the memory 330 as a breakage conditions data 333. Further, the result of the inundation simulation is stored in the outside storage device 320 as a simulation result file 321. The geographic information is data consisting of values connected to a place, a name of a station, and a local place name are examples of the geographic information.

Figure 4:
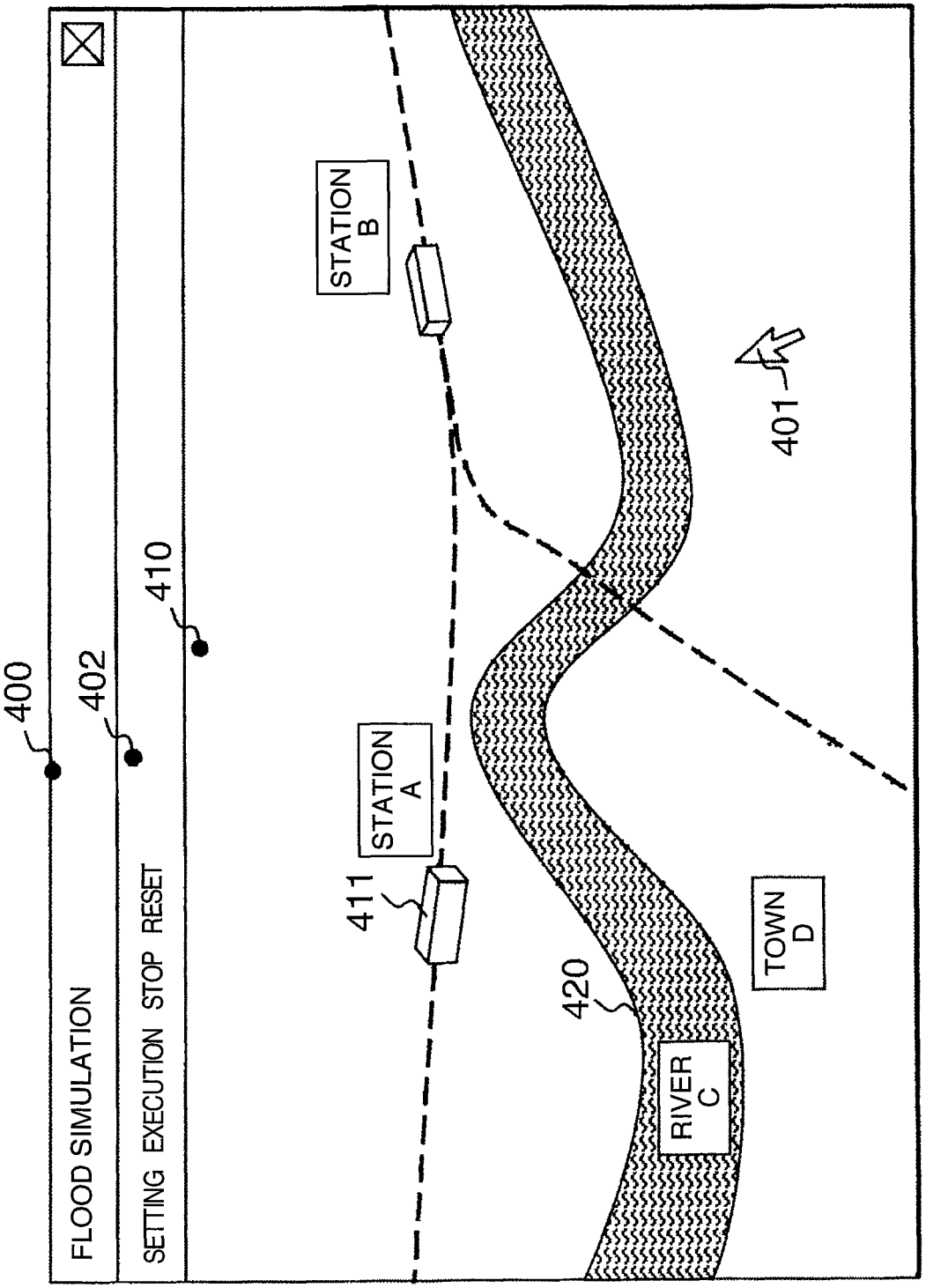
FIG. 4 is a diagram showing an example of the main GUI (Guided User Interface) of the inundation simulation program 331.

FIG. 4 is a diagram showing a main GUI (Guided User Interface) of the inundation simulation program 331. The user can set the bank breakage conditions and check the simulation result by using the GUI. A window 400 is displayed in a predetermined area of the display 313. The user can move the mouse pointer 401 by operating the mouse 312 and select and operate objects in the window. The objects in the window are a menu bar 402, a map 410 that enables operations such as "setting", "execution", "stop", "reset" and the like. When the user selects "setting" from the menu bar 402, processing of setting the bank breakage conditions starts. When the user selects "execution", processing of the simulation starts. When the user selects "stop", processing of the simulation stops. When the user selects "reset", set conditions or the halfway result of the simulation is discarded. As the user operates, the scale of the map 410 can be zoomed in and out, and the display range can be moved into east, west, south and north. On the map, a map read out from the geographic information file 322 is displayed. Any map will do if only it enables a user to visually recognize geographic information such as an aerial photo, a road map and the like. The map includes at least a river 420, and local places 411 and the like are also displayed.

Figure 5:
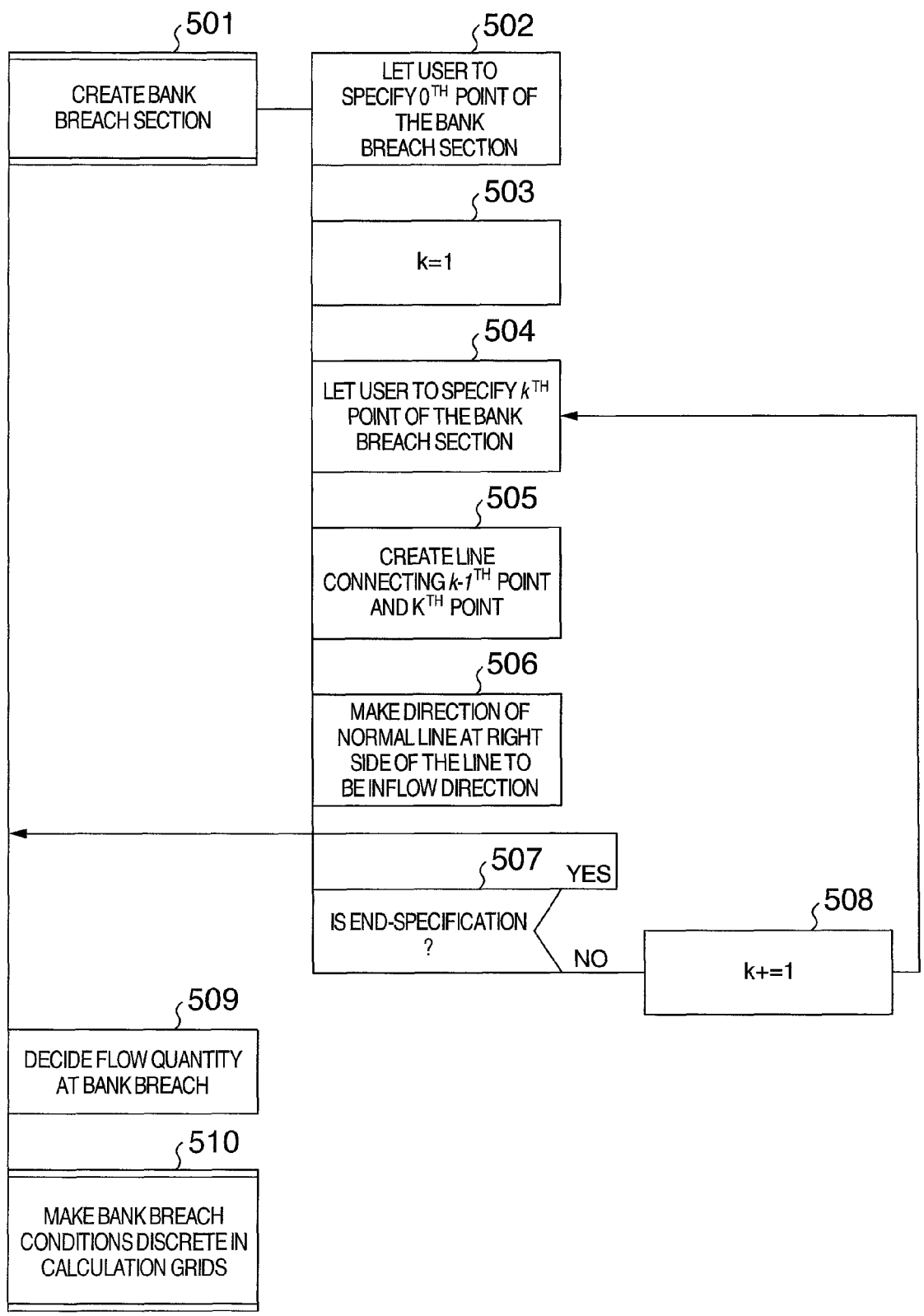
FIG. 5 is a diagram showing a PAD (Problem Analysis Diagram) relating to an example of a process of setting bank breakage conditions.

FIG. 5 is a PAD (Problem Analysis Diagram) diagram for setting processing of the bank breakage conditions. The setting processing starts when a user selects "setting" from the menu bar 405 and finishes when the user selects "execution" or "reset". The processing is largely divided into three steps. First, a bank breach section is created (step 501), then the fluid from the bank breakage is decided (step 509), and finally the bank breakage conditions are made discrete in the calculation grids space (step 510).

Step 501 consists of steps 502 to step 508. In these steps, a specification of the bank breakage section is received from the user and approximated by a curve or a line. When the user inputs, it is defined in advance to arrange control points on a line or a curve (end point and node point) in a predetermined order. For example, in the embodiment, it is assumed that a bank breakage section is approximated by a line graph (polyline) with control points of the polyline being input to be arranged from the left to the right seeing from the side of the city (inside area of the bank) to the side of the river (outside area of the bank). Hereinafter, the polylines r with the points $r_0, r_1, \ldots$ being control points are expressed as polyline ($r_0, r_1, \ldots$). Here, $r_k$: the $k^{th}$ control point of the polyline r, and rn: the number of the control points of the polyline r. The polyline r consists of the points from $r_0$ to $r_{rn-1}$[[. ]], where rn is the integer at two or more. Steps from 502 to 508 will be described with reference to FIG. 5 and FIG. 6 below.

At step 502, a user is let to specify the leftmost end of the bank breakage section by seeing from the city side to the river. The point is called the $0^{th}$ point ($r_0$). FIG. 6A is a diagram showing a part of the GUI that is operated by the user at step 502. In the embodiment, the user moves the mouse pointer 401 to a certain point on the map 410 and clicks the left button on the mouse 312 to specify the $0^{th}$ point in the bank breakage section. As shown in the FIG. 6A, it is desirable to display an icon 601 on the place of the $0^{th}$ point ($r_0$) to improve the convenience of the user.

At step 503, 1 is substituted in the index k of the control point of the polyline that is input at step 504. At step 504, a user is let to specify the $k^{th}$ point ($r_k$) in the bank breakage section. FIG. 6B is a diagram showing a part of the GUI that is operated by a user at step 504. As at step 502, in the embodiment, the user moves the mouse pointer 401 to a certain point on the map 410 and clicks or double clicks the left button on the mouse 312 to specify the $k^{th}$ point in the bank breakage section. As to be described later, in the embodiment, when the mouse is clicked, it is in the subsequent state waiting for input of the control points in the next bank breakage section, and when the mouse is double clicked, it is in the state where the input of the control points finished.

At step 505, a line connecting the k−1 point and the k point is created. Here, the $k^{th}$ point ($r_k$) is a point immediately specified by the user and the k−1$^{th}$ point ($r_{k-1}$) is the point specified by the user before the last. As shown in FIG. 6B, it is desirable to display a line 602 connecting the k−1$^{th}$ point to the $k^{th}$ point to improve the convenience of the user.

At step 506, as mentioned above, assuming that points are input in order from the left to the right as seeing from the city side (inside area of the bank) to the river side (outside area of the bank), a normal line $n_k$ at the right side is calculated by seeing from the k−1$^{th}$ point to the k$^{th}$ point and the normal line is made a direction of flow. The normal line $n_k$ is obtained by the expression $n_k$=outer_product (vector($r_{k-1}$, $r_k$), ez). Here, outer_product (a, b) is a function returning the outer product of the vector a and b, vector ($p_0$, $p_1$) is a function for returning a vector in which a point $p_0$ is a starting point and the point $p_1$ is a finishing point, and ez is a unit vector in the upper vertical direction. It is known that the flow that flows from the inflow section can be approximated by a flow over the side weir (inundation weir set at the river side). The flow is called side weir. It has been tried to estimate the flow quantity from the geographic shape of the weir. According to the study, the direction of the flow quantity is almost the same as the direction orthogonal to the weir. Therefore, here, the normal line $n_k$ is the direction of flow. It is also desirable to represent the direction of the flow quantity vector $n_k$ that is created to improve the convenience of the user is shown by an arrow 603 as shown in FIG. 6B. That enables a user to estimate the direction of the flow at the bank breakage place. It is also possible to display a tool chip 611 near the mouse pointer 401 with a length of bank breakage, i.e., a length of the bank breakage section being displayed there. The length of the bank breakage section is obtained by totaling the length (vector $(r_{i-1}, ri)$ of the line vector $(r_{i-1}, r_i)$ from the i-1$^{th}$ point to the i$^{th}$ point for the case where i takes a value from 1 to k.

At step 507, it is determined whether a user issued an instruction to finish the control point input or not. If the instruction to finish is issued, step 501 finishes and the operation proceeds to step 509. If the instruction to finish is not issued, 1 is added to k (step 508), and the operation returns to step 504. FIG. 6C is a diagram showing a part of the GUI that is operated by a user to issue an instruction to finish at step 507. In the embodiment, if the user clicks the left button on the mouse 312 at step 504, the instruction to finish is not issued and if the user double clicked, the instruction to finish is issued. It is desirable to display an icon 604 at a place of the control point (the rn−1th point) that is finally input as shown in FIG. 6C to improve the convenience of the user.

Although the bank breakage section is approximated by a polyline in the embodiment, it may be approximated by a curve such as a spline curve. In such a case, an input is enabled in a shape of the bank breakage section that is near to the realistic than a line is. In order to approximate the bank breakage section by a spline curve, it only needs to change step 505 to create the spline curve with the k−2$^{th}$ point, the k−1$^{th}$ point and the k$^{th}$ point being as control points. Further, step 506 may be changed to make the direction of the normal line $n_k$ that is at the right side when seen from the k−1$^{th}$ point to the k$^{th}$ point of the curve is the direction of flow. In the case of k<2, the spline curve cannot be created, thus, it is expressed by points or a polyline.

Although, in the embodiment, the control points of the polyline approximated the bank breakage section is input from the leftmost end as seen from the city side to the bank, they may be input from the rightmost end. In such a case, the orientation of the normal line at step 506 only needs to be changed from the right direction to the left direction.

In the embodiment, the direction of the normal line of the bank breakage section is assumed to be the flow direction of the amount of bank breakage flow. This assumption may be accurately holds good in the case where a difference between the water level of the river at the upstream end and the downstream end in the bank breakage section can be ignored. In the case of the bank breakage occurred at the steep inclined part or the crook in the river channel, the difference between the water level cannot be ignored. Therefore, it may be adapted to further receive a correction change of the direction of the normal line from a user.

The direction of the flow created at step 506 may be reverse to the direction intended by a user. This is because that the user may input the rightmost point in the bank breakage section seeing from the city side to the river first. For user's convenience, it is desirable to enable a user to reverse the direction of the flow quantity vector by simple operations. For that purpose, the embodiment provides a user interface for a user to reverse the direction of the flow after finishing step 501. FIG. 6D is a diagram showing the interface. If the user clicks the right button of the mouse 312 near the polyline 605 representing the bank breakage section after finishing step 501, a context menu 620 appears. If the user wants to reverse the direction of the flow quantity vector, the user only needs to select "reverse the direction" 621.

Figure 7:
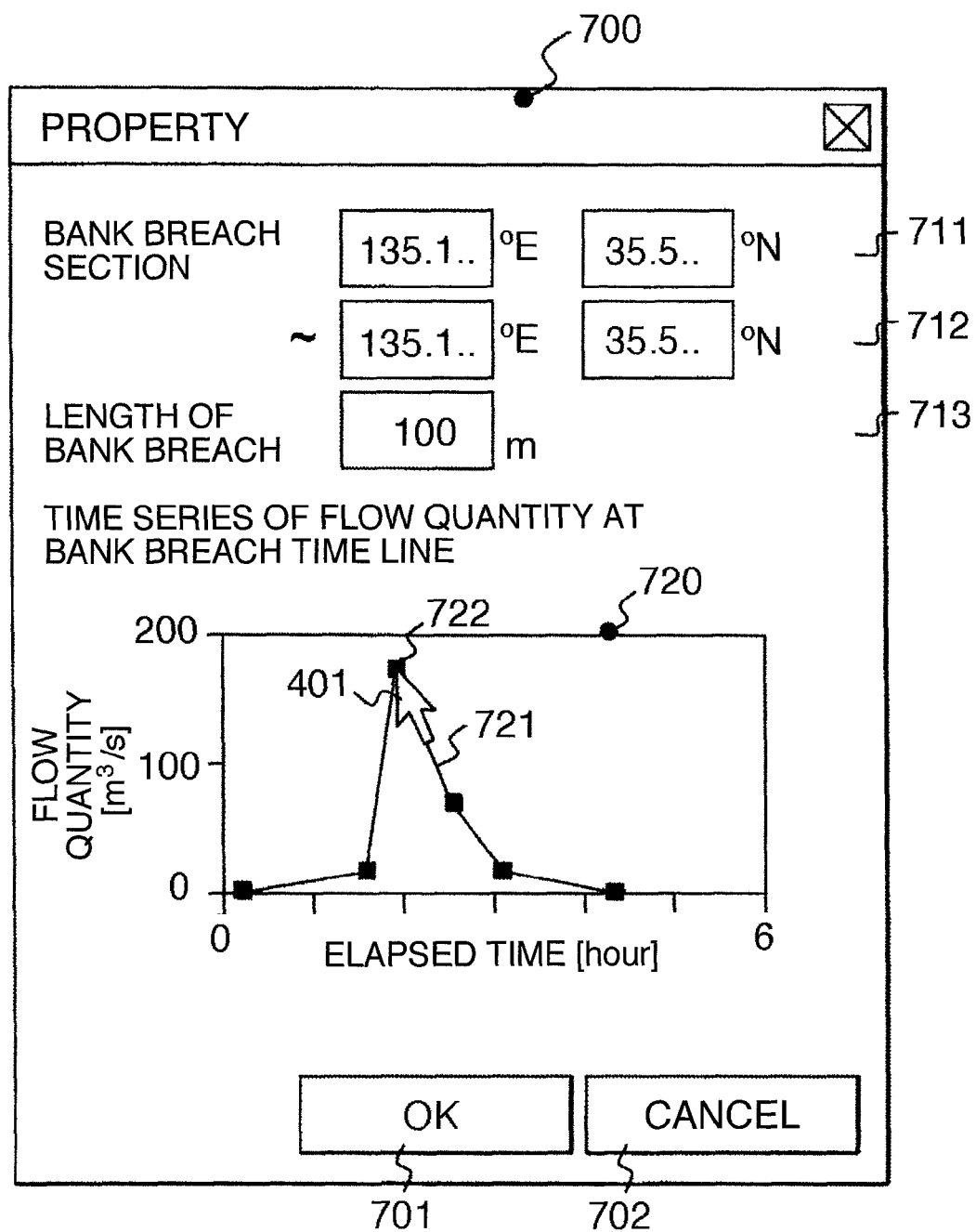
FIG. 7 is a diagram showing an example of the GUI for a user to change a flow quantity of the bank breakage.

Next, step 509 will be described with reference to FIG. 5 and FIG. 6, and also FIG. 7. At step 509, a time line $Q_{total}$ (t) of the flow quantity (the amount of bank breakage flow) to flow from the bank breakage section is decided. In the embodiment, an appropriate amount of bank breakage flow previously defined for the bank breakage section is automatically given so that the flow quantity can be changed according to the user's instruction. As the amount of bank breakage flow to present first, in the embodiment, the amount of bank breakage flow observed in past that is recorded in advance is used. FIG. 7 is a diagram showing a GUI for a user to change the amount of bank breakage flow. When the user displays the context menu 620 and selects "property" 622, a window 700 appears at a predetermined place on the display 313. The user can check the longitude and the latitude of the 0$^{th}$ point and the rn−1$^{th}$ point in the bank breakage section created by the user in the edit boxes 711 and 712 and the bank breakage length in the edit box 713 in the window 700. Further, change of the flow quantity from the bank breakage section in the time line is displayed by the line graph 721 in the graph 720. The horizontal axis of the graph 720 is the elapsed time and the vertical axis is the flow quantity. The user operates the mouse 312 to add, delete and move the control points 722 on the line graph to change the time line of the flow quantity. By pressing an OK button 701 after the change, the change is reflected, and by pressing the cancel button 702, the change is discarded. Although the flow quantity is a positive value in the embodiment, the flow quantity may be 0 or negative value. In the case of negative value, a phenomenon of backflow of water from the bank breakage section to the river can be expressed.

Step 509 may be implemented by letting a user to decide the water depth $\Delta h_{levee}$ of the river that is measured from the top of the bank (ceiling point) after the bank breakage in the bank breakage section. FIG. 6E is a diagram showing a part of the GUI by which the user inputs the water depth $\Delta h_{levee}$ of the river. When a user drags the icon 601 indicating the first input point or the icon 604 indicating the last input point above the three dimensional map 410, the icon 601 and 604 move above the map. At the same time, a polyline 606 connecting the icon 601 and 604 and a line 607 connecting the polyline 605 and 606 appears, with each of the polylines having a length according to an input by the user (direction denoted by the line 607). The polyline 605 represents the top of the bank (ceiling end), the polyline 606 represents a water surface, and the length of the line 607 is proportional to the water depth. The water depth is displayed on the tool chip 611 in addition to the bank breakage length. The user can input a value of a desired water depth with a dragging operation with reference to the tool chip 611. As such, such preparation of the GUI for inputting the water depth on the map enables the user to compare the water depth with the local places around. As the value of the water depth is generally short compare to the value of the length of the bank breakage, it is preferable to increase the map scaling in the vertical direction to emphasize the water depth. In order to obtain the amount of bank breakage flow $Q_{total}$ from the water depth $\Delta h_{levee}$ input by the user, the expression below is used.

$$Q_{total} = C * \text{LENGTH}(r_0, r_{rn-1}) * (\Delta h_{levee})^{1.5} \quad (1)$$

Here, C: inundation coefficient (in the embodiment, C=1.55), LENGTH $(r_0, r_{rn-1})$: the total length of the polyline r, i.e., LENGTH$(r_0, r_{rn-1})$=(length(vector$(r_0, r_1)$)+...+length(vector$(r_{rn-2}, r_{rn-1})$) with always $\Delta h_{levee}$>0. If step 509 is realized in this manner, $Q_{total}$ is a constant independent of a time. If $Q_{total}$ is dependent on time, the GUI shown in FIG. 7 may be used.

Figure 8:
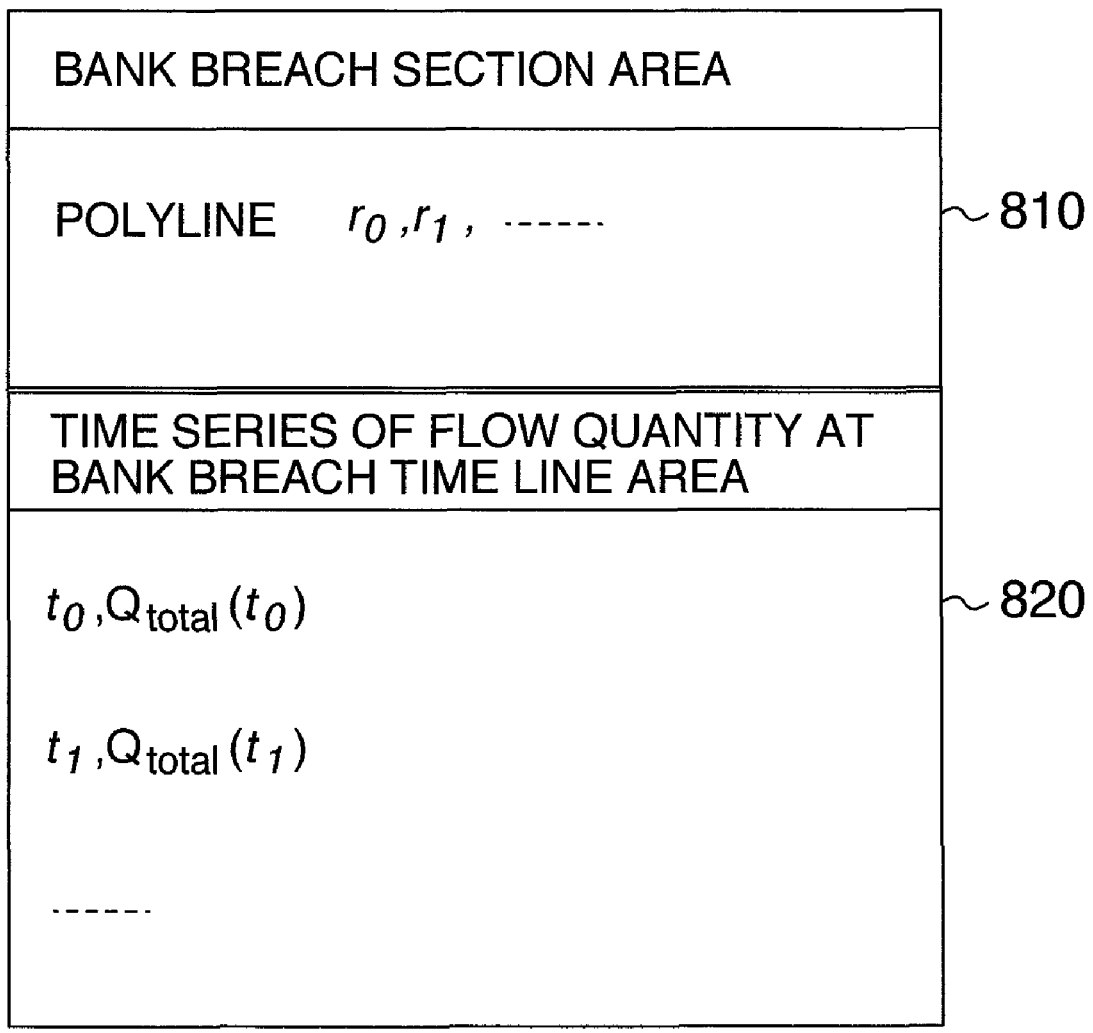
FIG. 8 is a diagram showing an example of a structure on a memory of the bank breakage conditions data 333 of the first embodiment.

The bank breakage conditions have been created at step 501 and step 509. The created bank breakage conditions are developed as the bank breakage conditions data 333 in the memory 330. FIG. 8 is a diagram showing a structure on the memory of the bank breakage conditions data 333 in the embodiment. The bank breakage conditions data consists of a bank breakage section area 801 and the flow quantity time line area 820. The bank breakage section area 810 stores the control points $r_0, r_1, \ldots$ of the polyline. The time line area of the flow quantity 820 stores elapsed times $t_0, t_1, \ldots$ of control points shown in the graph 720 and the flow quantity at the time $Q_{total}(t_0)$, $Q_{total}(t_1)$, .... If the $Q_{total}$ is a constant independent of a time, a value indicating that does not change in time that is defined in advance only needs to be input as $t_0$ in the time line area 820 of the flow quantity. The elapsed time and the flow quantity may be values in the elapsed time that are interpolated as required. The bank breakage conditions data 333 may be saved in the outside storage device 320 as a file.

Figure 9:
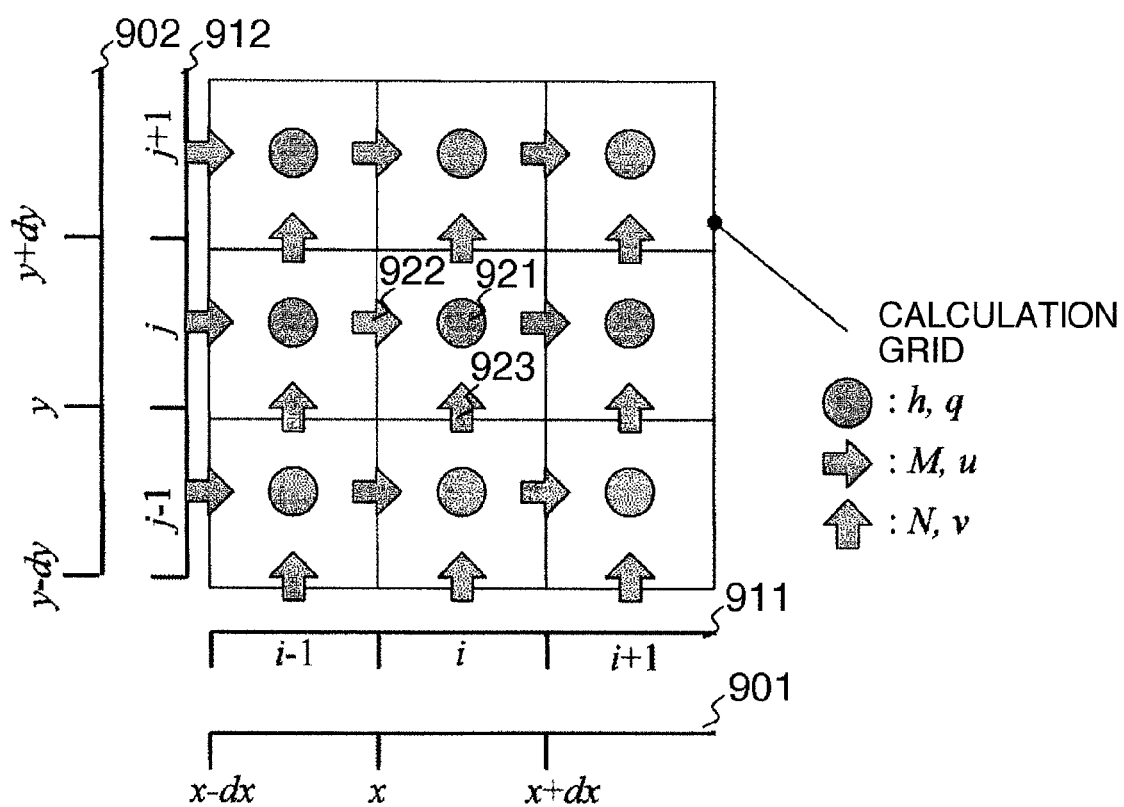
FIG. 9 is a diagram showing an example of a calculation grid arrangement of the first embodiment.

At step 510, the bank breakage conditions data 333 is made discrete in the calculation grids space, and substituted in the prediction variable. Here, first, the calculation grid/grids space will be described. The calculation grid/grids space is a space represented by a calculation grid/grids used in the simulation and a place in the space is represented on the coordinate (i, j) with variables i, j that only takes an integer values. The calculation grid/grids is made available to be converted with the coordinate (x, y) representing the real space. FIG. 9 is a diagram showing the calculation grid/grids of the embodiment. The x axis 901 and the y axis 902 represent distances from the origin with east and north as positive directions respectively. Conversion of the x axis 901 and i axis 911, y axis 902 and j axis 912 are i=floor (x/dx), j=floor (y/dy). The dx and dy are the sizes of the calculation grids in the direction of x axis and y axis, respectively, and floor (a) is a function for returning an integral value that cuts below the decimal point of an argument a. The predicting values h, q, u, v, M, N are arranged in the calculation grids. Here, h: water depth, q: the flow quantity, u, v: the flow velocity in the direction of x axis and y axis, respectively, M, N: the flow flux (M=u*h, N=v*h). Hereinafter, the prediction variable Var in the calculation grid/grids coordinate (i, j) is represented as $Var_{i,j}$. As staggered grid is used in the embodiment, the places 922 of the predicting values $u_{i,j}$ and $M_{i,j}$ are shifted by −dx/2 to the places 921 of the $h_{i,j}$ and $q_{i,j}$, respectively. Similarly, the places 923 of the $v_{i,j}$ and $N_{i,j}$ are shifted by −dy/2 to the places 921 of the $h_{i,j}$ and $q_{i,j}$, respectively.

Next, a method for converting the bank breakage conditions into predicting values will be described. There are some types of a method for converting the bank breakage conditions into the prediction variables. As the present embodiment provides a converting method appropriate for the state, a user may select any of the three methods below. 1) Calculate the flow quantity flux near the bank breakage section M, N from the bank breakage flow quantity $Q_{total}$, 2) Calculate the flow quantity q near the bank breakage section from the amount of bank breakage flow $Q_{total}$, 3) Calculate the water depth h near the bank breakage section from the amount of bank breakage flow $Q_{total}$. In the method of 1), the momentum at bank breach is easily conserved. In the method of 2), the mass at the bank breach is easily conserved. In the method of 3), a simulation tends to be stable. The user may select any of the methods in advance.

Figure 10:
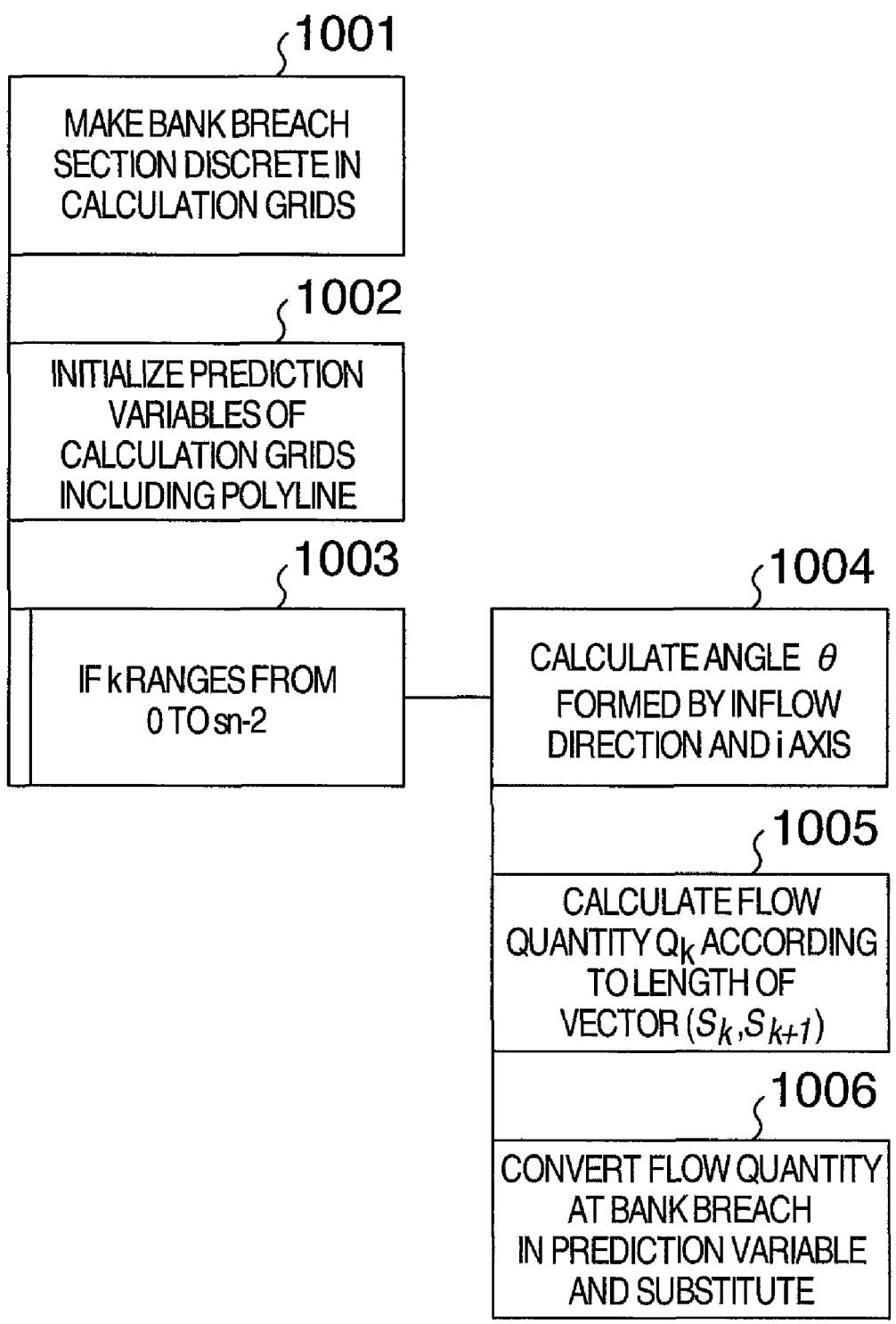
FIG. 10 is a PAD diagram showing details of an example at step 510 in FIG. 5.

FIG. 10 is a PAD diagram showing details of step 510. Step 510 consists of steps 1001 to 1006.

Figure 11:
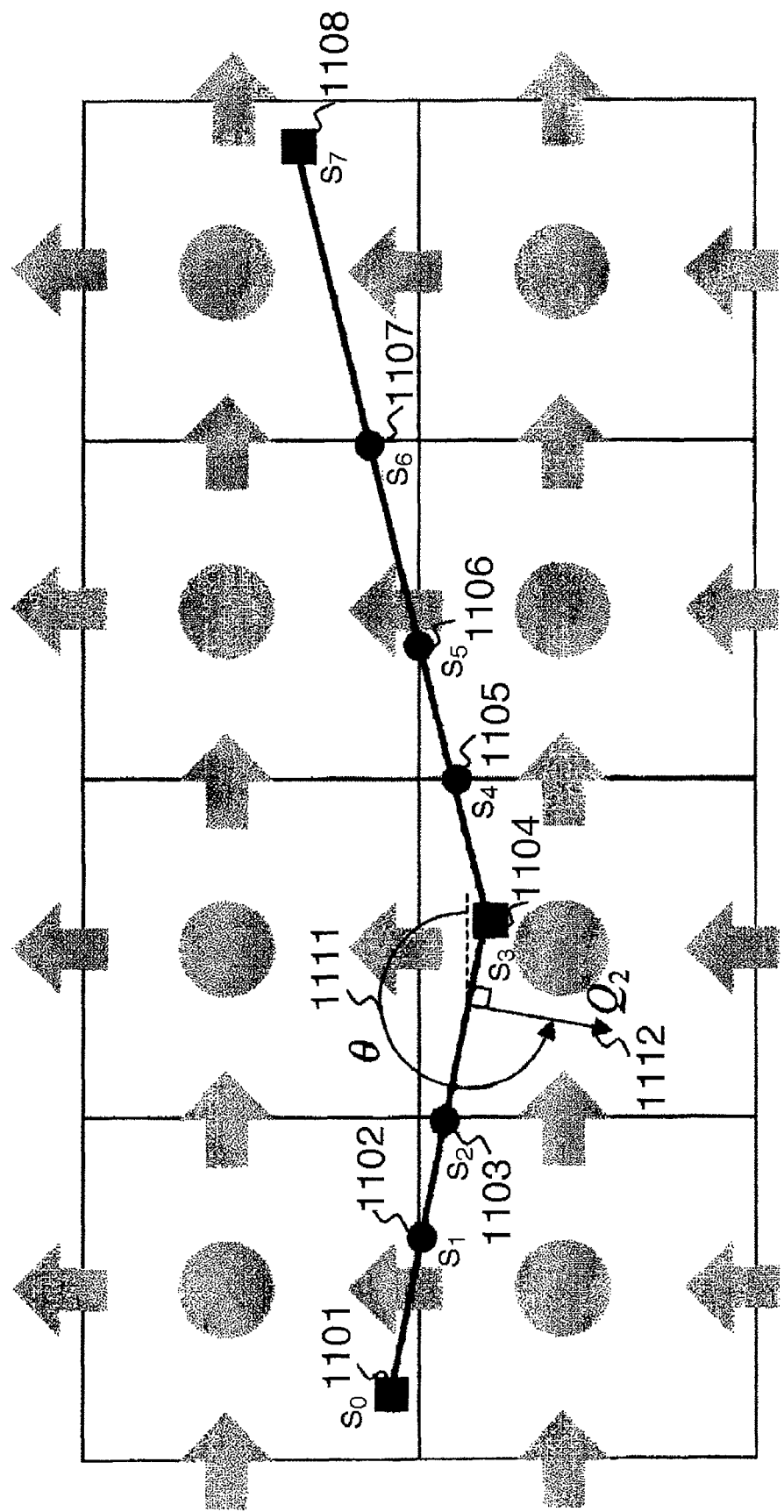
FIG. 11 is a diagram showing a method for breaking up bank breakage section in a calculation grid arrangement.

At step 1001, the bank breakage sections are made discrete in the calculation grid/grids space. FIG. 11 is a diagram for describing a method for making the bank breakage section in the calculation grid/grids space. For making it discrete, first, points of intersection of the polyline ($r_0, r_1, \ldots$) and the i axis and the j axis are obtained. In the figure, the points of intersection of the polyline and the i axis are shown by points 1102 and 1106 and the points of intersection of the polyline and the j axis are shown by points 1103 and 1105 and 1107. A polyline ($s_0, s_1, \ldots$) is newly created with the obtained points of intersection and the control points of the original polyline $r_0, r_1, \ldots$ as control points. The number of the control points of the polyline is sn.

At step 1002, the prediction variables of the calculation grid/grids including the bank breakage section are initialized. As a method for expressing the bank breakage conditions by prediction variables, any of the three expressions mentioned above can be selected. Assuming that vector $(s_k, s_{k+1})$ is included in the calculation grid/grids i, j, initialization for each will be described. If the method 1) of converting the amount of bank breakage flow is converted into the flow quantity flux M. N is used, the initialization shown below will be performed.

$$M_{i+1,j}=0 \tag{2-1}$$

$$M_{i,j}=0 \tag{2-2}$$

$$N_{i,j+1}=0 \tag{3-1}$$

$$N_{i,j}=0 \tag{3-2}$$

If the method 2) of converting the amount of bank breakage flow into the flow quantity q is used, the initialization shown below will be performed.

$$q_{i,j}=0 \tag{4-1}$$

If the method 3) of converting the amount of bank breakage flow into the water depth h is used, the initialization shown below will be performed.

$$h_{i,j}=0 \tag{5-1}$$

At step 1003, the index k of the control points for processing at step 1004 to 1005 is incremented from 0 to sn−2 by one.

At step 1004, an angle θ formed by the direction of the amount of bank breakage flow $n_k$ and i axis is calculated. FIG. 11 shows the angle θ (1111) formed by the direction $n_2$ of the amount of bank breakage flow $Q_2$ (1112) in the vector $(s_2, s_3)$ and i axis. The direction $n_k$ of the amount of the bank breakage flow has been calculated at step 506. The angle θ between the direction and i axis can be calculated by q=a cos(innter_product ($n_k$, ei)/length ($n_k$)). Here, inner_product (a, b) is a function for returning an inner product of the vector a and b, and a cos( ) is a function for returning an arc cosin, and ei is a unit vector in the i axis direction.

At step 1005, the quantity of the flow quantity $Q_k(t)$ according to the length of the vector $(s_k, s_{k+1})$ is calculated. The calculation of $Q_k(t)$ may be $Q_k(t)=Q_{total}(t)$*length (vector($s_k, s_{k+1}$))/LENGTH ($s_0, s_{sn-1}$).

At step 1006, the bank of breakage conditions are converted into the prediction variables and substituted. As a method for expressing the bank of breakage conditions by the prediction variables, any of the three expressions as mentioned above may be selected in the embodiment. Here, assuming that vector $(s_k, s_{k+1})$ is included in the calculation grid/grids i, j, each converting method will be described. The method 1) for converting the amount of the bank breakage flow $Q_k(t)$ into the flow quantity flux M, N uses the expressions below.

$$\text{If } \cos(\theta) \geq 0, M_{i+1,j} +=(Q_k/dx)*\cos(\theta) \tag{2-3}$$

$$\text{If } \cos(\theta) < 0, M_{i,j} +=(Q_k/dx)*\cos(\theta) \tag{2-4}$$

$$\text{If } \sin(\theta) \geq 0, N_{i,j+1} +=(Q_k/dy)*\sin(\theta) \tag{3-3}$$

$$\text{If } \sin(\theta) < 0, N_{i,j} +=(Q_k/dy)*\sin(\theta) \tag{3-4}$$

Here, the operator+means the operation of adding the current value of the variable at the left side and the value at the right side, and substitute the resulted value in the variable at the left side. With the operation, a case where the direction of the flow quantity changes in the grids such as the grids including the controlling points s3 (1104), for example, can be addressed. The method 2) for converting the amount of bank breakage flow $Q_k(t)$ into the flow quantity q uses the expression below.

$$q_{i,j} \mathrel{+}= Q_k \qquad (4\text{-}2)$$

The method 3) for converting the amount of bank breakage flow $Q_k(t)$ into the water depth h uses the expression below.

$$h_{i,j} \mathrel{+}= Q_k/(C^*\text{length}(s_k,s_{k+1}))^{2/3} \qquad (5\text{-}2)$$

Here, C: inundation coefficient and C=1.55 in the embodiment. In the methods 2) and 3), the flow velocity may occur into both the city side (inside area of the bank) and the river side (outside area of the bank) from the bank breakage section. In order to prevent that, the expressions below are preferably used.

$$\text{If } \cos(\theta) \geqq 0, M_{i,j}=0 \qquad (6\text{-}1)$$

$$\text{If } \cos(\theta) < 0, M_{i+1,j}=0 \qquad (6\text{-}2)$$

$$\text{If } \sin(\theta) \geqq 0, N_{i,j}=0 \qquad (7\text{-}1)$$

$$\text{If } \sin(\theta) < 0, N_{i,j+1}=0 \qquad (7\text{-}2)$$

Figure 12:
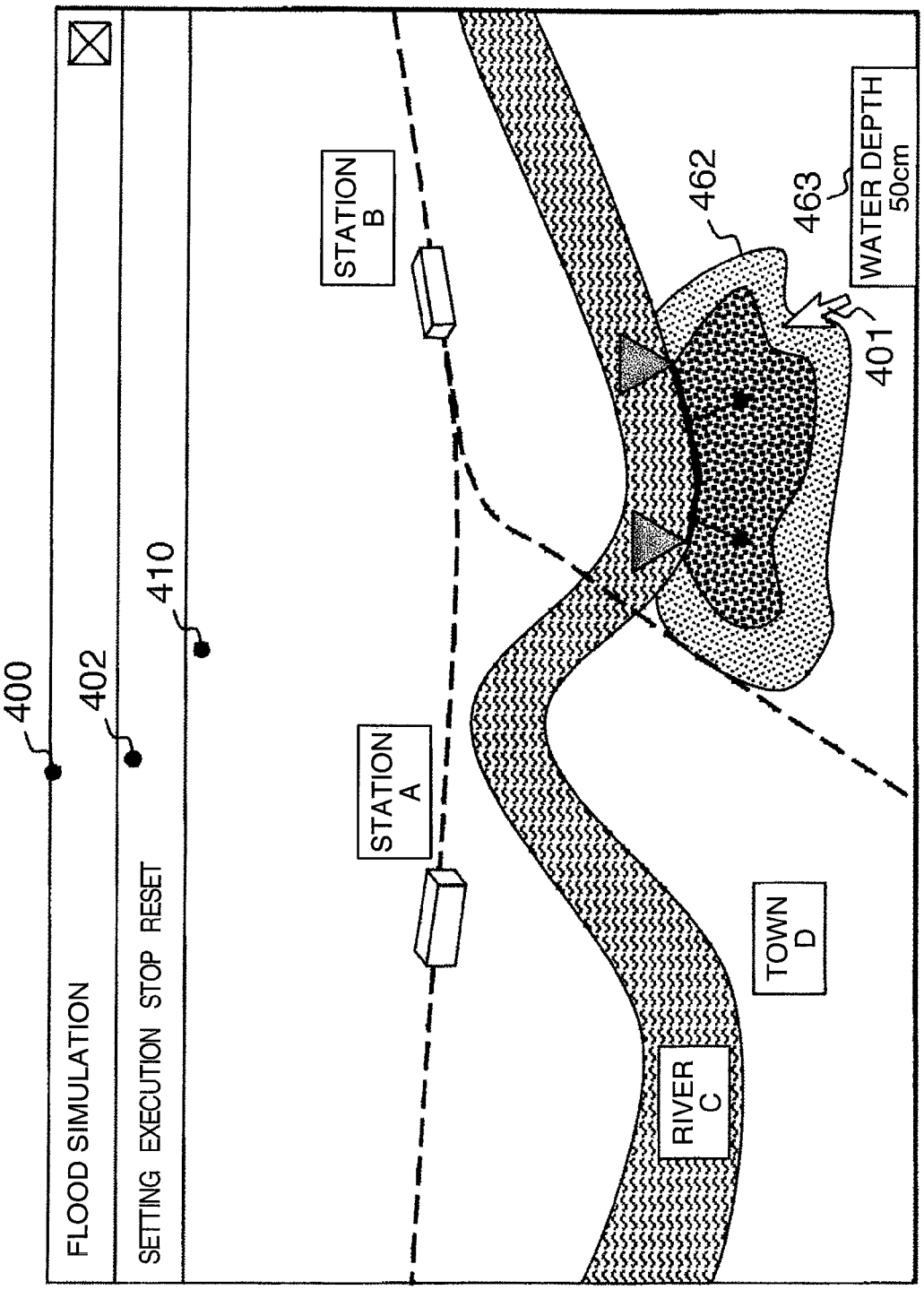
FIG. 12 is a diagram showing an example of the GUI several seconds after the simulation processing has started.

The setting of the bank breakage conditions from step 501 to step 510 has completed. The user selects "execution" from the menu bar 402 and starts the processing of the simulation. FIG. 12 is a diagram showing the GUI that is several seconds after from the simulation processing started. The shape of the polygon 462 superimposed on the map 410 indicates the flooded area and the color of the polygon 462 indicates the flooded depth. For convenience of the user, it is desirable to display the tool chip 463 near the mouse pointer 401 with the flooded depth displayed at the place of the mouse pointer inside.

In the simulation, the effects by the conditional setting by the abovementioned GUI are shown below. 1. As the inflow section is shown in shape, the inflow section can be expressed on the map. That enables a user to correctly input the place and the shape of the inflow section. 2. The direction of the amount of bank breakage flow can be estimated. That enables inflow flux to be automatically set as boundary conditions. 3. Even if the inflow section is on a single calculation grid/grids or over a plurality of calculation grids, conditions of the inflow section can be input. Thus the user can input a condition of the inflow section without being aware of the size of a calculation grid/grids.

[Embodiment 2]

Figure 13:
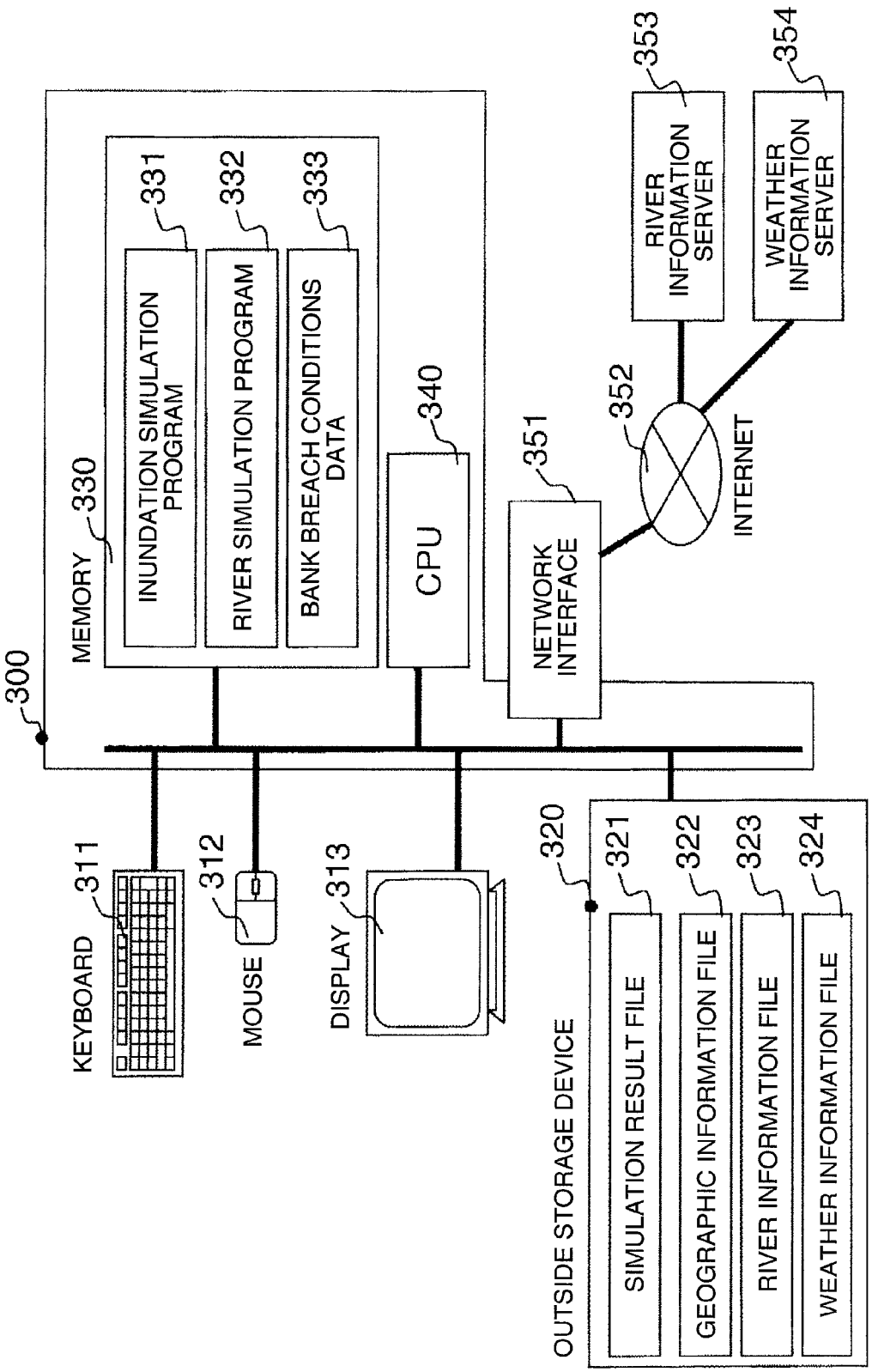
FIG. 13 is a general block diagram showing an example of a configuration of a computer system for implementing the present invention according to a second embodiment.

FIG. 13 is a block diagram showing a configuration of the computer system for implementing the present invention in the Embodiment 2. FIG. 13 shows a FIG. 3 shown referenced in the Embodiment 1 added with the blocks below: a river information file 323, a weather information file 324, a river simulation program 332, a network interface 351, the Internet 352, a river information server 353, a weather information server 354. In the river information file 323, a bank shape, a current view of the river, a shape of a horizontal section, a shape of a vertical section, a distance sign (a distance from the reference point such as an estuary to the present point along the river) and the like are recorded. As the bank shape is approximated by the polyline and the like, the system can recognize the place and the shape of the bank. In the weather information file 324, a past precipitation time line and the like are stored. The river simulation program 332 calculates the water level or the flow velocity of the river by using data stored in the river information file 323. The PC 300 is connected with the river information server 353, the weather information server 354 via the network interface 351 and the Internet 352. The river information server 353 distributes the latest observatory value and a predicting value about the river water level. The weather information server 354 distributes the latest observatory value and a predicting value about the precipitation.

Figure 14:
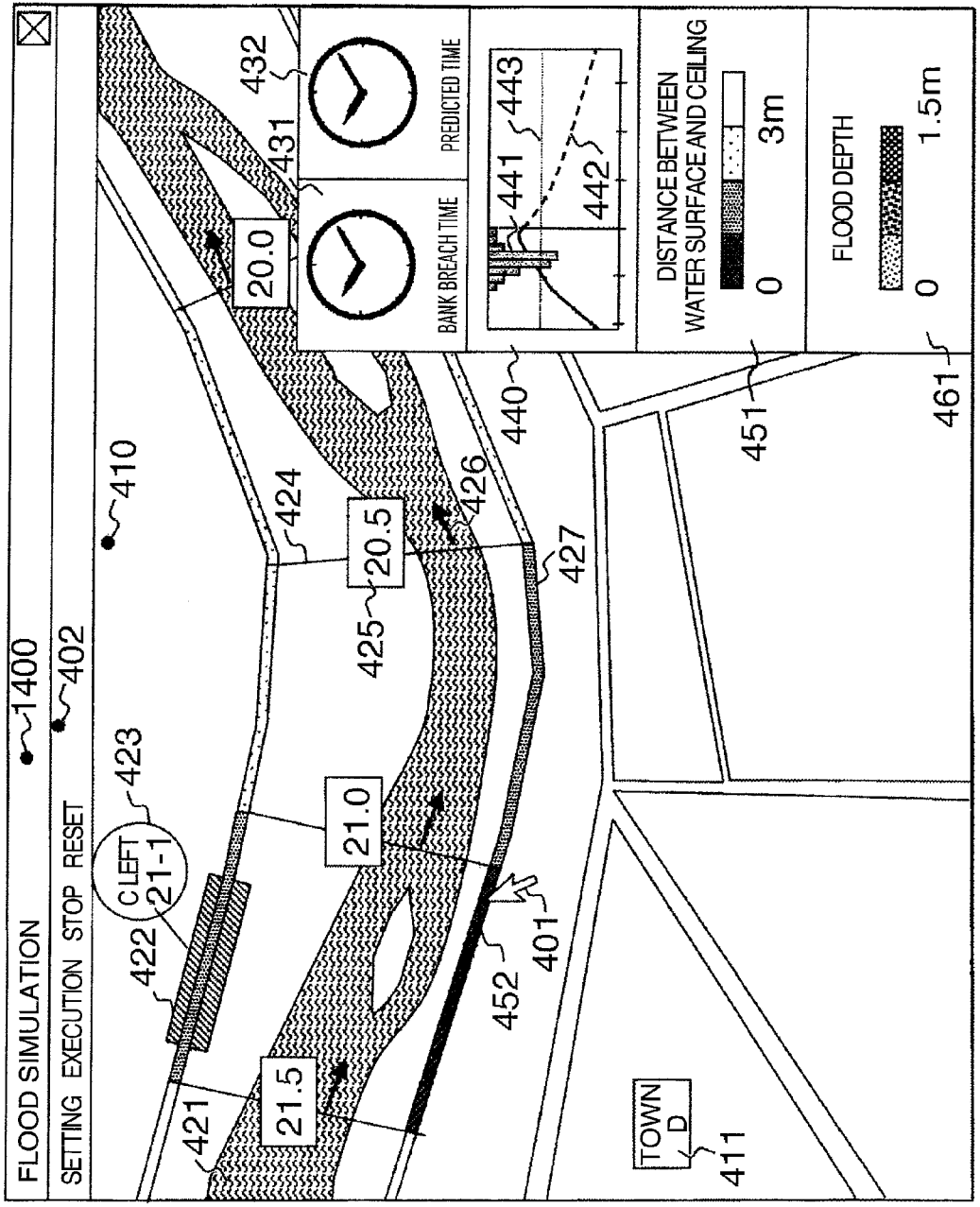
FIG. 14 is a diagram showing an example of the main GUI of the inundation simulation program 331 in FIG. 13.

FIG. 14 is a diagram showing a main GUI of the inundation simulation program 331. On the map 410 in the window 1400, a local place 411 read out from the geographic information file 322, and also information on the river (421 to 427), information on time (431 and 432), information on weather and river (440 to 443), information on the bank (451 and 452), information on inundation simulation (461).

It is preferable to display the river channel normal line 421 on the map 410 to provide a user with materials to estimate the bank breakage critical place. That is based on the fact that an experienced user can reads the places with shallow water depths and the fast flow velocities such as a shoal, and the places with deep water depths and slow flow velocities such as deeps from the river channel and estimate influences of waters to the bank. If places that needs to be observed with much attention are specified (important levee protection places), the icon 422 and the management number 423 are preferably displayed on the places. Cross-sectional lines 424 may be superimposed on the river with certain intervals and a distance sign 425 may be displayed. The direction to the downstream 426 of the river and the bank normal line 427 may also be displayed. The information may be obtained from the river information file 323 or the rive information server 353 stored in the outside storage device 320. In such a manner, they can be displayed for a user familiar with managing the geographic information around the river with a relative position to the river or distance sign to easily recognize the places in the bank breakage section. Further, by displaying the important levee protection places, it enables a user to easily recognize the places with possibility of bank breakage.

It is preferable to display the bank breakage time 341 and the predicting time 432 as information on time. In the bank breakage time 431 column, the time when the bank breakage started is preferably displayed, and in the predicting time 432 column, times by the simulation is preferably displayed. That enables a user to easily recognize the time when the bank breakage started and the times in the simulation, and also the time difference between them.

As information on the weather and the river, the water level of the river and the precipitation amount graph 440 are preferably displayed. In the graph 440, the precipitation for each unit time near the place selected by the user with the mouse pointer 401 is shown by a bar graph 441 and a river water level time line is shown by a sequential line graph 442. The designed high water level is preferably shown by the crossbar 443. The information is preferably obtained from the river information file 323 and the weather information file 324 stored in the outside storage device 320 or the river information server 353 and the weather information server 354. Alternatively, it is preferably obtained from the simulation result file 321 recording the information on the river simulation program 332.

As information on the bank, a distance between the water surface and the top of the bank (ceiling) is preferably displayed by color at the place 452 of the bank on the map. The explanatory note 451 is preferably displayed. The information is preferably obtained from the river information file 323 or the river information server 353 stored in the outside storage device 320. Alternatively, it is preferably obtained from the simulation result file 321 recording the information of the river simulation program 332.

As the information of the inundation simulation, the flooded depth is preferably displayed by color. The explanatory note 461 is preferably displayed. The information is preferably obtained from the simulation result file 321 recording the information of the inundation simulation program 331.

Figure 15:
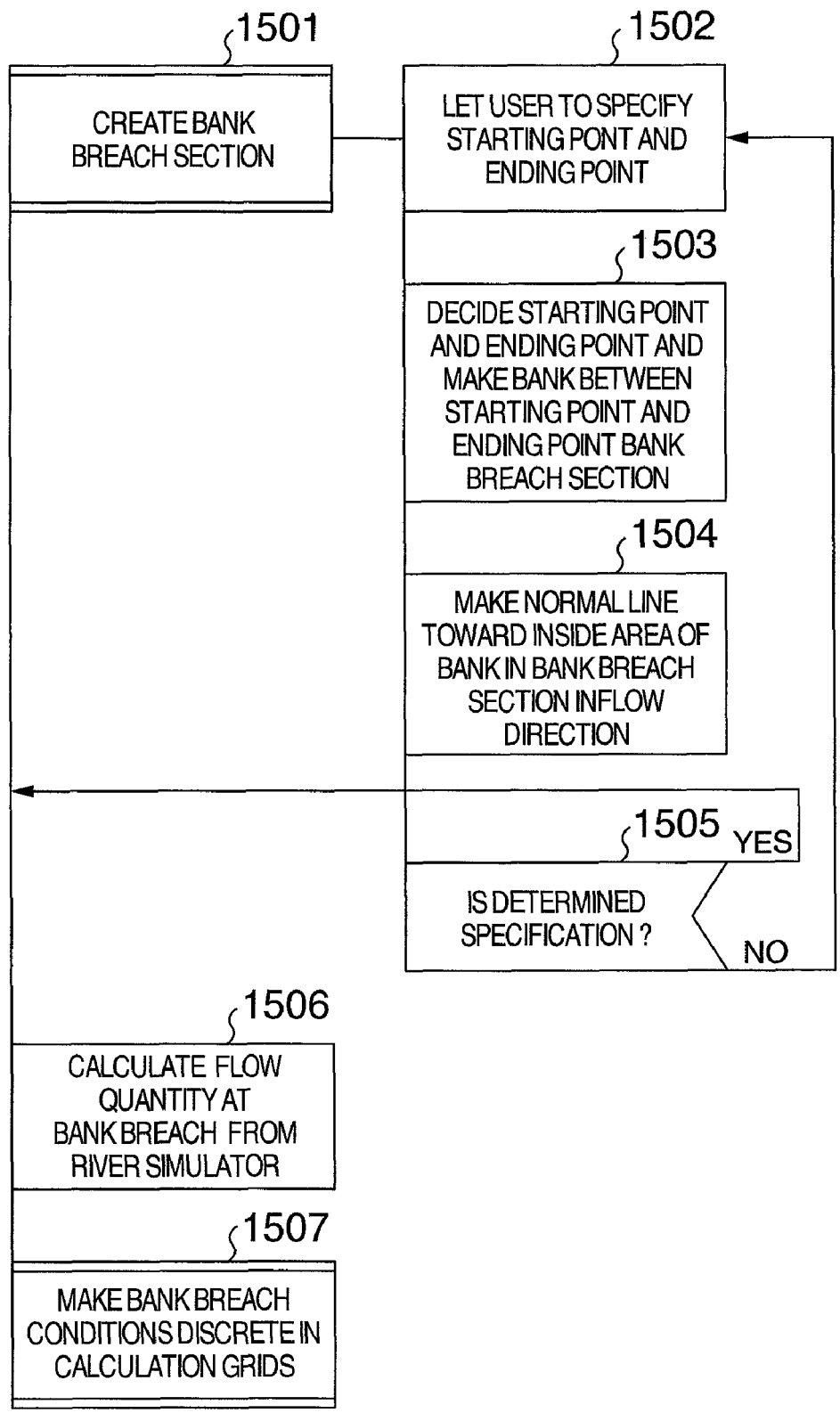
FIG. 15 is a PAD diagram relating to an example of the setting processing of the bank conditions.

The user can set the inundation conditions by using GUI shown in FIG. 14. FIG. 15 is a PDA diagram for the setting processing of the bank breakage conditions.

Step 1501 consists of steps 1502 to 1505. In steps, the bank breakage section is approximated by the sequential line graph (polyline) with node points of zero or more as in the embodiment 1 and points forming the polyline are arranged from the left to the right as seeing from the city to the bank. By using information on the bank stored in the river information file 323, the amount of information required for a user to input can be less than that of the first embodiment. Step for creating the bank breakage section will be described with reference to FIGS. 15 and 16 below.

At step 1502, a user is let to specify the starting point candidate and the ending point candidate. FIG. 16A is a diagram showing a part of GUI by which the user performs step 1502. In the embodiment, the user clicks a point on the map 410 and drags to create a shape for selection and specifies the starting point candidate and the ending point candidate by the physical relationship between the shape and the bank. In the figure, a rectangle 633 whose diagonal line connects the clicked place 631 and the present place 632 of the mouse pointer and whose sides are on the horizontal direction and the vertical direction of the display 313 is made a shape for selection and the bank that crosses the shape for selection is selected as the starting point candidate and the ending point candidate. For the user who is familiar with selection using a rectangle, this selection method is intuitively recognized. The shapes for selection needs not to be a rectangle and may be a circle centering on the clicked place with a radius of a distance between the clicked place and the place of the present mouse pointer. A method using the circle selection is convenient in the case where the bank breakage is over the wide area.

At step 1503, the starting point and the ending point are decided, making the bank between the starting point and the ending point the bank breakage section. From the physical relationship between the selection shape created at step 1502 and the bank, the starting point and the ending point of the bank breakage section are searched. In the embodiment, the points of intersection of the selection shape and the bank are made the starting point or the ending point. Here, among the points of intersection of the selection shape and the bank, the point with the minimum value of the distance sign is made the starting point and that with the maximum value is made the ending point. The place of the bank is preferably obtained from the river information file 323. Next, among the control points of the bank, the control point with the value at the distance sign of the starting point and with the value at the distance sign of the ending point is selected from the river information file 323. If the selected control point is not present, a polyline with the starting point and the ending point being end points is created. If the selected control point is present, a polyline that connects the starting point, the ending point, and the selected control point so that the distance sign of them are arranged in the ascending order is created. Hereinafter, that polyline is called as the bank breakage section. As shown in FIG. 16A, the bank breakage section created at step 1503 is desirably displayed by the polyline 605 for improving the user's convenience.

At step 1504, a normal line toward the city (inside area of the bank) in the bank breakage section is made the direction of inflow. From the physical relationship between the bank breakage section created at step 1503 and the river channel place obtained from the river information file 323, whether the normal line toward the city in the bank breakage section is at the left or the right to the polyline can be determined. A method for calculating the normal line at the right of the polyline is that shown in the first embodiment. In the same manner, the normal line at the left to the polyline can be calculated. As shown in FIG. 16(a), the direction of inflow created at step 1504 is desirably denoted by the arrow 603 for improving the user's convenience. It is also desirable to display the tool chip 613 near the mouse pointer with the distance signs of the starting point and the ending point, the water level $h_{rep}$ of the representative points in the bank breakage section, and the length of the bank breakage B are desirably displayed. The distance signs of the starting point and the ending point are preferably obtained from the river information file 323. For the water level $h_{rep}$ of the representative point of the bank breakage section, the latest observed value of the river water level measure nearest to the bank breakage section is preferably obtained. Alternatively, among the water levels that can be obtained by the river simulation program 332, the value of the place nearest the bank breakage section is preferably obtained. A method for calculating the length of the bank breakage B is as shown in the first embodiment.

The length of arrow 603 may be proportional to the flow quantity for each unit length at the representative point in the bank breakage section. That enables the arrow 603 to show the magnitude and the direction of the flow quantity $Q_{total}$ at the bank breakage place at the same time. The length of the arrow $L_{arrow}$ may be calculated by the expression below by using the water level $h_{rep}$ at the representative point of the bank breakage section.

$$L_{arrow}=L_Q*q_{rep} \qquad (8\text{-}1)$$

$$Q_{rep}=C*(h_{rep}-z_{rep})^{1.5} \qquad (8\text{-}2)$$

Here, $L_Q$: the number of pixels corresponding to the unit flow quantity, $q_{rep}$: the flow quantity for each unit length at the representative point in the bank breakage section, C: inundation coefficient (C=1.55 in the embodiment), and $z_{rep}$: the hight of the ceiling at the representative point in the bank breakage section (altitude), and always $h_{rep} \geqq z_{rep}$ holds. $z_{rep}$ may be obtained from the river information file 323 or may let the user to specify as required.

Alternatively, the length of the arrow 603 may be proportional to the flow velocity at the representative point in the bank breakage section. The length of the arrow $L_{arrow}$ may be calculated by using the water level $h_{rep}$ at the representative point in the bank breakage section by the expression below.

$$L_{arrow}=L_U*U_{rep} \qquad (9\text{-}1)$$

$$U_{rep}=C*(h_{rep}-z_{rep})^{0.5} \qquad (9\text{-}2)$$

Here, $L_U$: the number of pixels corresponding to the unit flow velocity, $U_{rep}$: the flow velocity at the representative point in the bank breakage section.

Alternatively, the flow of the length of the arrow $L_{arrow}$ may be a distance that the flow advances in a unit time period. In such a case, the coefficient $L_U$ of the expression (9-1) may be obtained by the expression below, and the length of the arrow $L_{arrow}$ may be obtained by using that coefficient by the above-mentioned expression (9-1) and (9-2).

$$L_U = T_{unit} * \text{scale} * \text{resol} \quad (10)$$

Here, $T_{unit}$: the unit time, scale: scale of the map 410, resol: resolution of the display 313. For example, if a map with the scale 1/25,000 (scale=$4.0*10^{-5}$) is used on a display of 72 dpi (resol=$2.8*10^3$ pixel/m) and a distance the flow advances at the bank breakage place at the maximum flow velocity for ten minutes ($T_{unit}$=600 sec) is desired to be expressed by the length of the arrow $L_{arrow}$, $L_U$=68 pixel*sec/m.

At step 1505, whether an ending instruction is received from the user or not is determined. If the ending instruction is received, step 1501 is finished and the operation proceeds to step 1506. If the ending instruction is not received, the operation returns to step 1502. FIG. 6B is a diagram showing a part of the GUI by which a user issues an ending instruction at step 1505. In the embodiment, if the user keeps dragging the mouse 312, the ending instruction is not present, and if the user leaves the left button of the mouse 312, the ending instruction is present. As shown in FIG. 6B, it is desirable to display the icons 601 and 604 and the like are displayed at the starting point and the ending point respectively for improving the user's convenience.

At step 1506, the amount of bank breakage flow is calculated from the rived simulation program 332. In the embodiment, among the water levels obtained by the river simulation program 332, the value nearest to the bank breach section is obtained as the river water level in the bank breach section and from the river water level, the amount of the bank breach flow is calculated. In order to obtain the amount of bank breach flow $Q_{total}$ from the river water level H, the expression below can be used.

$$Q_{total} = C * B * (h_{rep} - z_{rep})^{1.5} \quad (11)$$

The bank breach conditions have been created from steps 1501 and 1506. The created bank breach conditions are extracted in the memory 330 as the bank breach condition data 333. FIG. 17 is a diagram showing a structure on the memory of the bank breach condition data 333 of the embodiment. The bank breach condition date includes the bank breach section areas 1710. The bank breach section area 1710 stores the bank breach starting time $t_0$, the starting point $r_0(t_0)$ and the ending point $r_1(t_0)$ in the bank breach section at the time, and the ceiling height after the bank breach occurs in the bank breach section $z_{rep}(t_0)$. Hereinafter, $r_0(t)$, $r_1(t)$, $z_{rep}(t)$ at the time t between the bank breach starting time $t_0$ and the bank breach ending time $t_1$ are repeatedly stored. The bank breach condition data 333 may be saved in the outside storage device 320 as a file.

At step 1507, the bank breach conditions are made discrete in the calculation grids space. The method is as shown in the first embodiment.

Figure 18:
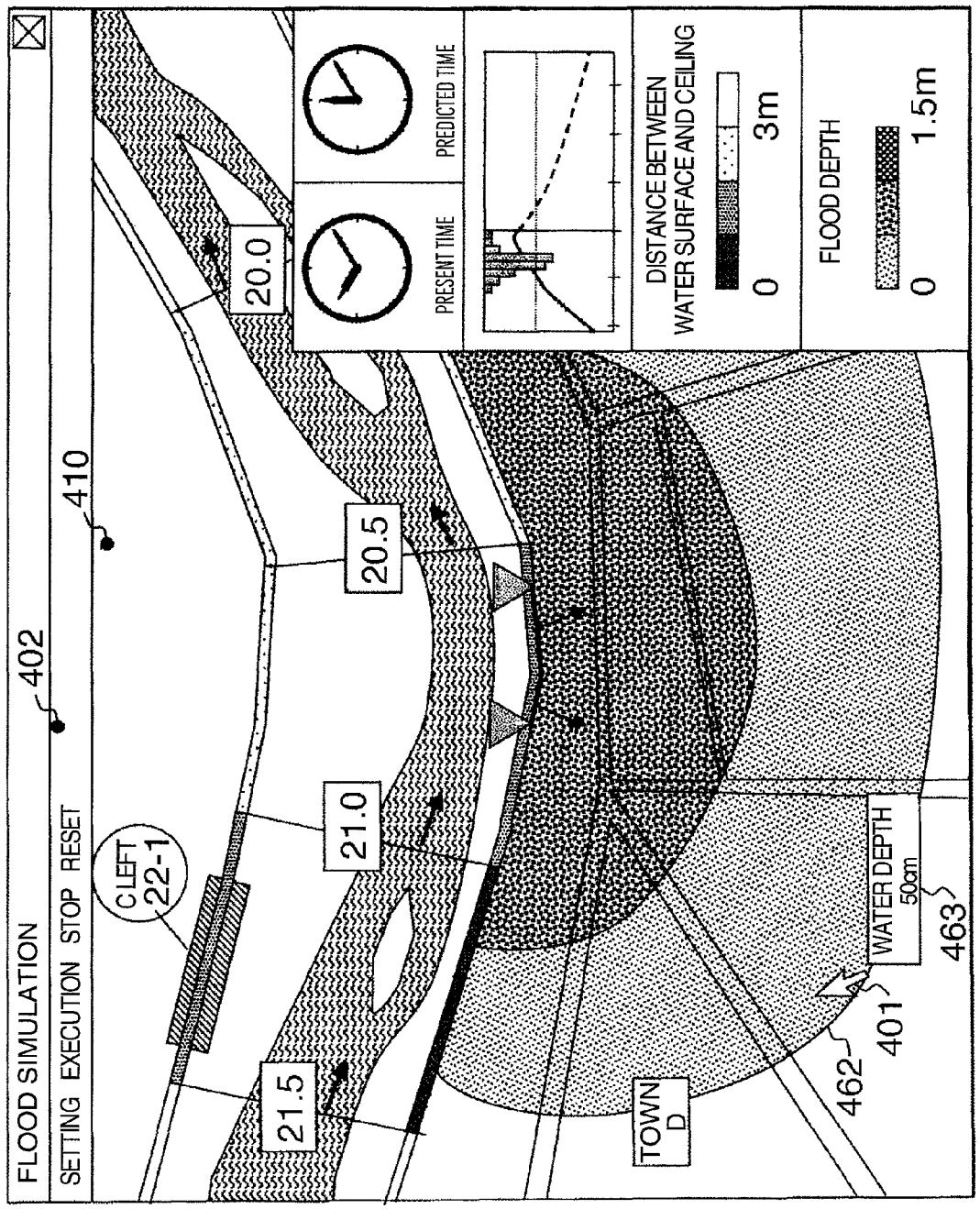
FIG. 18 is a diagram showing an example of the GUI several seconds after the simulation processing has started.

The bank breach conditions from step 1501 to step 1507 have been set. The user selects "execution" from the menu bar 402 and starts the processing of the simulation. FIG. 18 is a diagram showing a GUI that is several seconds after when the processing of the simulation started. The shape of the polygon 462 that is superimposed on the map 410 shows the flooded area and the color of the polygon 462 shows the flood depth. For the user's convenience, it is desirable to display the tool chip 463 near the mouse pointer 401 with the flood depth at the place of the mouse pointer displayed inside.

Although the breakage of the bank of the river is exemplified as a cause of the inundation phenomenon in the embodiment, a phenomenon of water overflowing from a linear structure as the bank breach, inundation, flooding, high tide, tidal wave and the like other than the bank breach can be considered. It is apparent from the embodiment that the present invention can be applied to the inundation simulation caused by the phenomena.

As mentioned above, according to the present invention, the inundation simulation can be simply set to be applied to the estimation of the flooding disaster and the like.

It should be further understood by those skilled in the art that although the foregoing description has been made of the embodiments of the invention, the invention is not limited thereto and various changes and modifications may be made without departing from the spirit of the invention and the scope of the appended claims.

The invention claimed is:

1. A computer implemented method comprising the steps of:
    displaying a map including at least one river bank on a display unit;
    specifying an inflow section of one or more portions of the river bank on the map;
    deriving at least one line segment corresponding to the one or more portions of the river bank based on the inflow section;
    calculating a flow quantity vector for each line segment based on a direction normal to the line segment and an angle defined by the direction normal to the line segment and a calculation grid axis;
    displaying the flow quantity vector for each corresponding line segment on the map on the display unit; and
    performing inundation simulation using the flow quantity vector.

2. The method according to claim 1, wherein
    the inflow section is defined from an input of two or more control points; and
    the line segment is derived by interpolating the control points with a line or a curved segment.

3. The method according to claim 2, wherein
    a direction of the flow quantity vector is parallel with a direction normal to the line segment toward a predetermined direction as viewed in a direction from a first control point to a next control point.

4. The method according to claim 1, wherein
    the map includes a river with place information on the map;
    the inflow section is specified by a line or a shape; and
    the line or the shape is determined by calculating points of intersection of the line or shape and a shape of the river, and connecting the points of intersection.

5. The method according to claim 1, wherein
    the inundation simulation receives as an input a time line of a flow quantity at the inflow section.

6. The method according to claim 1, wherein
    the inundation simulation receives as an input a water depth at the inflow section, and
    calculates the flow quantity vector at the inflow section based on the water depth.

7. The method according to claim 5, the method further comprising the steps of:
    obtaining the length of the line segment placed on a plurality of grids for each of the grids, which is a unit for performing the simulation;
    calculating a magnitude of the flow quantity vector for each of the grids from the flow quantity based on a length of the grids; and
    performing the simulation using the flow quantity vector for each of the grids.

8. The method according to claim 5, the method further comprising the steps of:
   obtaining the direction normal to the line segment placed on a plurality of grids for each of the grids, which is a unit for performing the inundation simulation; and
   performing the inundation simulation using the direction normal to the line segment for each of the grids.

9. The method according to claim 1, wherein
   the map is used to manage a shape of the river bank as a local place, and
   the shape of the river bank at the inflow section is determined as a line indicating the inflow section.

10. An inundation simulation device comprising:
    a display device for displaying a map including at least one river bank;
    an input device for receiving a specification of an inflow section of one or more portions of the river bank on the map; and
    a processing part for deriving at least one line segment indicating the inflow section from the specification and calculating a flow quantity vector for each line segment from a direction normal to the line segment and an angle defined by the direction normal to the line segment and a calculation grid axis;
    wherein the display device displays the flow quantity vector for each corresponding line segment with the inflow section on the map; and
    the processing part performs the inundation simulation using the flow quantity vector.

11. The inundation simulation device according to claim 10, wherein
    the processing part makes the direction normal to the line segment of the inflow section toward either side as seen in a direction from a first input control point to a next input control point and the normal line corresponds to the direction of the flow quantity vector.

12. A non-transitory computer readable medium having instruction for executing a method comprising the steps of:
    displaying a map including at least one river bank on a display unit;
    specifying an inflow section of one or more portions of the river bank on the map;
    deriving at least one line segment corresponding to the one or more portions of the river bank based on the inflow section;
    calculating a flow quantity vector for each line segment based on a direction normal to the line segment and an angle defined by the direction normal to the line segment and a calculation grid axis;
    displaying the flow quantity vector for each corresponding line segment on the map on the display unit; and
    performing inundation simulation using the flow quantity vector.

* * * * *